United States Patent
Gunnam et al.

(10) Patent No.: US 9,667,272 B1
(45) Date of Patent: May 30, 2017

(54) GENERIC ENCODER FOR LOW-DENSITY PARITY-CHECK (LDPC) CODES

(71) Applicant: Marvell International Ltd., Hamilton (BM)

(72) Inventors: Kiran Gunnam, Milpitas, CA (US); Nedeljko Varnica, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 138 days.

(21) Appl. No.: 14/801,273

(22) Filed: Jul. 16, 2015

Related U.S. Application Data

(63) Continuation of application No. 14/084,944, filed on Nov. 20, 2013, now Pat. No. 9,088,301, which is a continuation of application No. 13/482,489, filed on May 29, 2012, now Pat. No. 8,595,548, which is a continuation of application No. 12/187,858, filed on Aug. 7, 2008, now Pat. No. 8,196,010.

(60) Provisional application No. 60/978,912, filed on Oct. 10, 2007, provisional application No. 60/956,553, filed on Aug. 17, 2007.

(51) Int. Cl.
*G06F 11/00* (2006.01)
*H03M 13/11* (2006.01)
*H03M 13/00* (2006.01)

(52) U.S. Cl.
CPC ..... *H03M 13/1102* (2013.01); *H03M 13/616* (2013.01); *H03M 13/6527* (2013.01)

(58) Field of Classification Search
CPC .................................................... G05F 11/10
See application file for complete search history.

(56) References Cited

U.S. PATENT DOCUMENTS

| | | | |
|---|---|---|---|
| 5,440,604 | A | 8/1995 | De Subijana et al. |
| 6,789,227 | B2 | 9/2004 | De Souza et al. |
| 6,961,888 | B2 | 11/2005 | Jin et al. |
| 6,985,536 | B2 | 1/2006 | Oelcer et al. |
| 7,000,168 | B2 | 2/2006 | Kurtas et al. |

(Continued)

OTHER PUBLICATIONS 802.16e: IEEE Standard for Local and Metropolitan Area Networks Part 16: Air Interface for Fixed and Mobile Broadband Wireless Access Systems Amendment for Physical and Medium Access Control Layers for Combined Fixed and Mobile Operation in Licensed Bands, pp. 1-822 (Feb. 2006).

(Continued)

*Primary Examiner* — Christopher McCarthy

(57) ABSTRACT

Systems and methods are provided for encoding data based on an LDPC code using various inversion mechanisms to obtain parity bits. In some embodiments, an LDPC encoder may compute parity bits using a speculative recursion and correction mechanism. In these embodiments, the LDPC encoder may initiate a recursion using at least one speculative value in place of the actual value for a parity component. The speculative values may then be corrected using a correction factor. In other embodiments, an LDPC encoder is provided that can perform a blockwise inversion mechanism. This mechanism may be used on LDPC codes with parity check matrices having a parity portion composed partially of a large triangular matrix. In still other embodiments, a generic LDPC encoder is provided. The generic LDPC encoder can implement a variety of different encoding techniques, such as different inversion mechanisms, and may be processor-based or finite state machine-based.

20 Claims, 17 Drawing Sheets

(56) References Cited

U.S. PATENT DOCUMENTS

| | | |
|---|---|---|
| 7,234,098 B2 | 6/2007 | Eroz et al. |
| 7,434,135 B2 | 10/2008 | Yoshida |
| 7,502,982 B2 | 3/2009 | Silvus et al. |
| 7,506,238 B2 | 3/2009 | Hocevar |
| 7,562,278 B2 | 7/2009 | Lyakh et al. |
| 7,584,343 B2 | 9/2009 | Kirsch |
| 7,962,828 B2 | 6/2011 | Kyung et al. |
| 7,996,746 B2 | 8/2011 | Livshitz et al. |
| 8,059,762 B2 | 11/2011 | Said et al. |
| 2002/0136317 A1 | 9/2002 | Oelcer et al. |
| 2002/0188906 A1 | 12/2002 | Kurtas et al. |
| 2006/0123315 A1 | 6/2006 | Yoshida |
| 2006/0265634 A1 | 11/2006 | Silvus et al. |
| 2007/0038842 A1 | 2/2007 | Kirsch |
| 2009/0259915 A1 | 10/2009 | Livshitz et al. |
| 2010/0251059 A1 | 9/2010 | Dielissen |

OTHER PUBLICATIONS

IEEE P902.11 n/D2.00 Draft Standard for Information Technology—Telecommunications and information exchange between systems—Specific requirements—Part 11: Wireless LAN Medium Access Control (MAC) and Physical Layer (PHY) specifications: Amendment <number>: Enhancements for Higher Throughput, pp. 1-476 (Feb. 2007).

Strassen, "Gaussian Elimination is not Optimal," Numer. Math. 13:354-356 (1969).

$$\underbrace{\begin{bmatrix} 11 & -1 & 8 & 13 & 12 & 15 \\ 6 & 10 & -1 & 3 & 12 & -1 \\ 7 & 13 & 7 & -1 & -1 & 0 \\ 4 & 4 & 5 & 4 & -1 & -1 \\ 3 & 14 & 1 & -1 & 15 & 15 \end{bmatrix}}_{\text{data portion (A)}} \underbrace{\begin{bmatrix} 0 & -1 & -1 & -1 & -1 \\ 0 & 0 & -1 & -1 & -1 \\ -1 & -1 & 0 & -1 & -1 \\ -1 & -1 & -1 & 0 & 0 \\ -1 & -1 & -1 & -1 & 0 \end{bmatrix}}_{\text{parity portion (B)}} \begin{bmatrix} u_0 \\ \vdots \\ u_5 \\ \hline p_0 \\ \vdots \\ p_3 \end{bmatrix} = \overline{0}$$

$$\begin{bmatrix} 1^c & 1 & 1 & 1 & 1 & \cdots & 1 & 1 & 1 & 1 \\ & 1 & 1 & 1 & 1 & \cdots & 1 & 1 & 1 & 1 \\ & & 1 & 1 & 1 & \cdots & 1 & 1 & 1 & 1 \\ & & & 1 & 1 & \cdots & 1 & 1 & 1 & 1 \\ & & & & \ddots & & & & & \vdots \\ & & & & & 1^d & 1 & 1 & 1 & 1 \\ & & & & & & \ddots & & & \vdots \\ & & & & & & & 1 & 1 & 1 \\ & & & & & & & & 1 & 1 \\ & & & & & & & & & 1^c \end{bmatrix} \begin{bmatrix} p_0 \\ p_1 \\ p_2 \\ \vdots \\ p_{j-2} \\ p_{j-1} \\ p_j \\ \vdots \\ p_{n-2} \\ p_{n-1} \end{bmatrix} = \begin{bmatrix} x_0 \\ x_1 \\ x_2 \\ \vdots \\ x_j \\ x_{j-1} \\ x_j \\ \vdots \\ x_{n-2} \\ x_{n-1} \end{bmatrix}$$

$$\begin{bmatrix} r^{c00} & r^{c01} \\ r^{c10} & r^{c11} & r^{c12} \\ & r^{c21} & r^{c22} & r^{c23} \\ & & & & \ddots \\ & & & r^{cm1} & r^{cm2} \\ & & & & & \ddots & r^{cn3n4} & r^{cn3n3} & r^{cn3n2} \\ & & & & & & & r^{cn2n3} & r^{cn2n2} & r^{cn2n1} \\ & & & & & & & & r^{cn1n2} & r^{cn1n1} \end{bmatrix} \begin{bmatrix} p_0 \\ p_1 \\ p_2 \\ \vdots \\ p_{n-3} \\ p_{n-2} \\ p_{n-1} \end{bmatrix} = \begin{bmatrix} x_0 \\ x_1 \\ x_2 \\ \vdots \\ x_{n-3} \\ x_{n-2} \\ x_{n-1} \end{bmatrix}$$

GENERIC ENCODER FOR LOW-DENSITY PARITY-CHECK (LDPC) CODES

CROSS-REFERENCE TO RELATED APPLICATIONS

This application is a continuation of U.S. patent application Ser. No. 14/084,944, filed Nov. 20, 2013 (allowed), which is a continuation of U.S. patent application Ser. No. 13/482,489, filed May 29, 2012, now U.S. Pat. No. 8,595,548, which is a continuation of U.S. patent application Ser. No. 12/187,858, filed Aug. 7, 2008, now U.S. Pat. No. 8,196,010, which claims the benefit under 35 U.S.C. §119(e) of U.S. Provisional Application Nos. 60/956,553, filed Aug. 17, 2007, and 60/978,912, filed Oct. 10, 2007. This application is also related to U.S. application Ser. No. 12/024,720, filed Feb. 1, 2008. All of these prior applications are hereby incorporated by reference herein in their entirety.

BACKGROUND OF THE DISCLOSURE

The disclosed technology relates generally to data encoding, and more particularly to low-density parity check (LDPC) encoders.

With the continuing demand for high-reliability transmission of information in digital communication and storage systems, and with the rapid increase in available computational power, various coding and decoding techniques have been investigated and applied to increase the performance of these systems. One such coding technique, low-density parity check (LDPC) coding, was first proposed in the 1960s, but was not used until the late 1990s when researchers began to investigate iterative coding and decoding techniques.

LDPC codes are among the few known error control coding techniques capable of transmitting information at a rate close to the Shannon limit or channel-capacity. Currently, LDPC codes are considered to be the next-generation communication system encoding standard. LDPC codes can be regular or irregular, have a linear or cyclic encoding matrix, and can be decoded in a myriad of ways, ranging in complexity and error performance.

However, there are a few concerns with LDPC codes. The error floor of LDPC codes may be of particular concern; in several applications, low error floors are required. However, it may be difficult to implement a low error floor LDPC code without making the code block length large. Lengthy LDPC codes, on the other hand, may require large memory buffers and/or computational power, even though the parity-check matrix is sparse. Due to the potentially large memory and computational requirements of suitably powerful LDPC encoders, the flexibility of these LDPC encoders is typically lower than desired.

SUMMARY OF THE DISCLOSURE

Accordingly, low-density parity check (LDPC) encoders are disclosed that provide parameter programmability and are capable of operating using LDPC codes with parity check matrices having various properties.

In some embodiments, the disclosed LDPC encoder may include an input buffer, a matrix-vector multiplication unit, a product buffer, and an inversion unit. The input buffer stores a message that will be encoded by the LDPC encoder. The matrix-vector multiplication unit obtains the message from the input buffer, and multiplies the message by a first sub-matrix of a parity check matrix. The first sub-matrix may be referred to as the "data portion" or the "A matrix" of the parity check matrix. The resulting matrix-vector product is stored in the product buffer. The inversion unit may then perform an inversion operation on the matrix-vector product using the remaining, second sub-matrix of the parity check matrix. This second sub-matrix may be referred to as the "parity portion" or the "B matrix" of the parity check matrix, since the inversion operation produces a plurality of parity symbols in accordance with the LDPC code. The LDPC encoder may use these parity symbols to create a systematic LDPC codeword by concatenating the message with the computed parity symbols, for example.

Optionally, the LDPC encoder may operate subsequent to or concurrently with an outer code encoder, such as a Bose-Chaudhuri-Hocquenghem (BCH) or Reed-Solomon (RS) encoder. In these embodiments, the message encoded by the LDPC encoder may include outer code parity symbols.

In accordance with some embodiments of the present invention, an inversion unit may have the capability to operate using a plurality of inversion mechanisms. In some cases, the inversion unit may use a particular inversion mechanism based on the properties of the parity check matrix. Thus, the inversion unit (and therefore the LDPC encoder) can operate using LDPC codes with a variety of different parity check matrix structures. For example, the inversion unit may recursively compute parity symbols for LDPC codes with dual-diagonal B matrices. Also, for smaller parity check matrices, the inversion unit may store the inverse of the parity portion of a parity check matrix and compute parity symbols by multiplication with the stored inverse.

In some embodiments of the present invention, the inversion unit may recursively compute parity symbols, but where the recursion is initiated using at least one speculative value. For simplicity, this type of inversion mechanism may sometimes be referred to as a speculative recursion. For example, for LDPC codes that are composed of a tri-diagonal sub-matrix, the inversion unit may use the values of two previous parity symbols in a sequence to compute a symbol value for a next parity symbol in the sequence. The inversion unit may initiate the recursion using the actual value of one parity symbol, but a speculative value of the other parity symbol. For example, the other parity symbol may be set to zero for purposes of the recursion.

At the completion of the recursion, the inversion unit may have computed a value of most or all of the parity symbols in the sequence. In some embodiments, a portion of the computed values may be speculative values, while a remaining portion may be actual values. For one of the parity symbols for which a speculative value is computed, the inversion unit may also compute the actual value of that parity symbol. The inversion unit may then compare the speculative value of the parity symbol with the actual value of that parity symbol to obtain a correction factor. This correction factor is applied to each of the speculative values to produce the actual value for each associated parity symbol.

In some embodiments, the inversion unit may compute parity symbols using a blockwise inversion technique. In these embodiments, the inversion unit may partition the parity portion of a parity check matrix into multiple blocks, and compute the parity symbols using these blocks. The blockwise inversion technique may be especially effective for LDPC codes with parity check matrices having parity portions that can be partitioned into different sized blocks, where one of the larger blocks is triangular. Thus, rather than computing inverses of these blocks using resource-intensive computations, the inverse of any of the smaller blocks may be stored, while the inversion unit can simply perform back substitution on the larger, triangular block.

In some embodiments, an LDPC encoder constructed in accordance with the present invention may be generic in that the LDPC encoder may have an inversion unit capable of operating using one or more, if not all, of the inversion techniques described above. In particular, the LDPC encoder may have an inversion unit capable of computing parity symbols based on one or more of: back substitution, recursion, multiplication using a stored inverse, speculative recursion and correction, and blockwise inversion. To support different inversion techniques, the generic LDPC encoder may include a control unit that is based on a processor or a finite state machine. The control unit may instruct various peripheral components, such as memory components (e.g., a instruction RAM/ROM, scratch memory, input buffers, output buffers, etc.) and computational units (e.g., XOR, SHIFT, and AND computational units), to perform LDPC encoding functions, such as any of the above-described inversion mechanisms.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which:

FIG. 2 is an LDPC coding equation based on a quasi-cyclic parity check matrix;

FIG. 3 is a 16×16 matrix representing one circulant from the parity check matrix in FIG. 2;

FIG. 5 is a partial LDPC coding equation based on a quasi-cyclic parity check matrix with a dual-diagonal parity portion;

FIG. 7 is a partial LDPC coding equation based on a quasi-cyclic parity check matrix with a tri-diagonal parity portion, where the tri-diagonal parity portion includes additional non-zero circulants;

DETAILED DESCRIPTION OF THE DISCLOSURE

Figure 1:
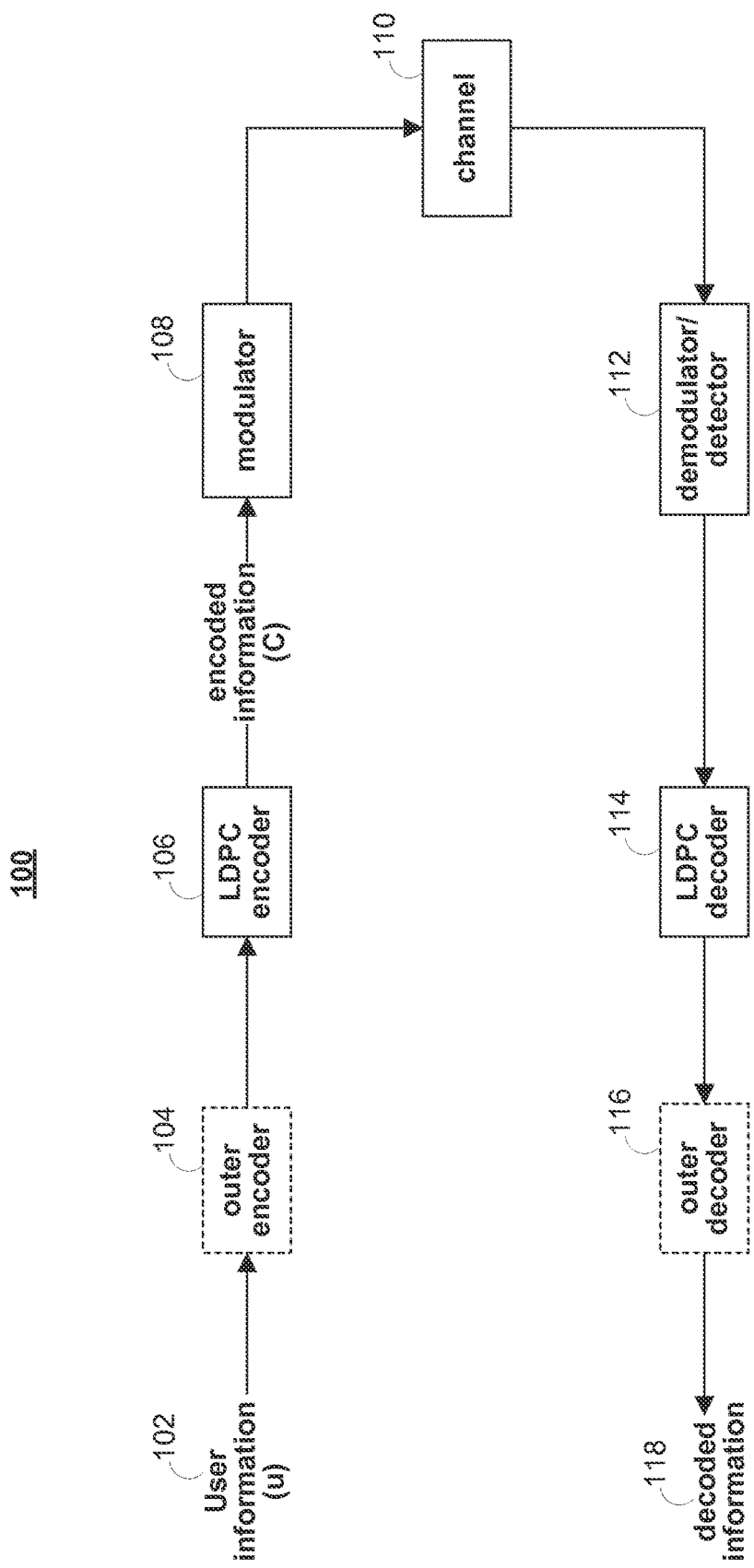
FIG. 1 is a simplified block diagram of an LDPC error-correcting communications or storage system.

FIG. 1 shows a simplified and illustrative block diagram of digital communications or storage system 100 that can employ the disclosed technology. System 100 may include LDPC encoder 106, modulator 108, demodulator 112, and LDPC decoder 114, and optionally outer encoder 104 and outer decoder 116. In some embodiments, system 100 may be any suitable communications system that is used to transmit user information 102 from a source to a destination. In other embodiments, system 100 may be a suitable storage system which is used to store and read back user information from a storage medium. User information 102, sometimes referred to by the variable u, may be any form of information or useful data that a user desires to transmit or store, and can be in any suitable digital form (e.g., coded data, uncoded data, etc.).

User information 102 may be transmitted or stored using one or more information-bearing signals. The signals may be transmitted or stored in any suitable transmission or storage medium or media, represented in FIG. 1 by channel 110. For example, channel 110 may be a wired or wireless medium through which the information-bearing signal travels, or an optical (e.g., a CD-ROM), magnetic (e.g., a hard disk), or electrical (e.g., FLASH memory or RAM) storage medium that stores the information-bearing signal. Due to random noise that may occur during transmission and storage, as well as the limited transmission or storage capabilities of channel 110, the information-bearing signal may be corrupted or degraded while being transmitted or stored. Thus, the signal received from channel 110 (e.g., by demodulator 112) may be substantially different than the signal that was originally transmitted or stored (e.g., from modulator 108). To reliably transmit or store information in channel 110, an effective transmitter for preparing and transmitting user information 102 may be needed, as well as a corresponding effective receiver for accurately interpreting user information 102 from a received signal.

In FIG. 1, the transmitter in communications or storage system 100 is embodied by outer encoder 104 (if present), LDPC encoder 106, and modulator 108. The receiver (described below) is embodied by demodulator 112, LDPC decoder 114, and outer decoder 116 (if present). Outer encoder 104 and LDPC encoder 106 may encode user information 102 into encoded information, sometimes referred to by the variable, C. In particular, outer encoder 104 may first encode user information 102 using a suitable code, which may be a systematic code. For example, outer encoder 104 may encode user information 102 using a Bose-Chaudhuri-Hocquenghem (BCH) or Reed-Solomon (RS) code of any suitable correction power. LDPC encoder 106 may then encode the resulting codeword into encoded information C. LDPC encoder 106 may operate concurrently or subsequent to outer encoder 104 using a suitable low-density parity check (LDPC) code that is selected from among a plurality of available LDPC codes. In some embodiments, LDPC encoder 106 may utilize a suitable quasi-cyclic LDPC (QC-LDPC) parity check matrix to perform the encoding, such as the QC-LDPC parity check matrix shown in FIG. 2, described below.

Once LDPC encoder 106 produces the encoded information, modulator 108 may convert the encoded information into an information-bearing signal for transmission or storage in channel 110. Modulator 108 may operate using a modulation scheme with a signal constellation set of any suitable size and dimension. For example, modulator 108 may use a quadrature amplitude modulation (QAM) scheme (e.g., 4QAM, 16QAM, 32QAM, etc.), a pulse amplitude modulation (PAM) scheme (e.g., 2PAM, 4PAM, 8PAM, etc.), a phase shift keying (PSK) scheme (e.g., QPSK, 8PSK, etc.), and/or a orthogonal frequency division multiplexing (OFDM) scheme. The type of modulation scheme used by modulator 108 may be selected and implemented based on the properties of channel 110.

Demodulator 112 may receive an altered version of the information-bearing signal transmitted or stored by modulator 108. Demodulator 112 may then convert the information-bearing signal back into a digital sequence using the same modulation scheme as that of modulator 108. Demodulator 112 therefore produces a hard-bit or soft-bit estimate of the encoded information, C, that is decoded by LDPC decoder 114 and outer decoder 116. LDPC decoder 114 and outer decoder 116 may decode the estimated encoded information using the same LDPC and outer code, respectively, as those used by LDPC encoder 106 and outer encoder 108 to produce decoded information 108. Thus, if the hard-bit or soft-bit estimate is within the correcting capability of the LDPC and outer codes employed by decoders 114 and 116, decoded information 108 may be the same as user information 102.

As described above, communications or storage system 100 may or may not include outer encoder 104 and outer decoder 116. For purposes of clarity, and not by way of limitation, the various embodiments disclosed herein will often be described as if no outer code is used. For example, various embodiments may be described in which an LDPC encoder directly encodes user information (e.g., LDPC encoder 106 directly encoders user information 102). However, it should be understood that any of the disclosed embodiments of an LDPC encoder may instead encode the output of an outer encoder.

FIG. 2 shows illustrative coding equation 200 that is satisfied when LDPC encoder 106 (FIG. 1) generates encoded information, C, based on a QC-LDPC code defined by parity check matrix 201. In particular, LDPC encoder 106 creates the encoded information, C, in the form of codeword vector 205 using parity check matrix 201. Codeword vector 205 is composed of user information sub-vector 206, having data components $u_0 \ldots u_5$, and parity sub-vector 208, having parity components $p_0 \ldots p_3$. Since user information sub-vector 206 represents user information 102 (FIG. 1) in vector form, LDPC encoder 106 (FIG. 1) generates codeword vector 205 by computing the parity components of parity sub-vector 208.

Parity check matrix 201 is an illustrative parity check matrix defining a particular quasi-cyclic LDPC code that may be employed by LDPC encoder 106 (FIG. 1) and LDPC decoder 114 (FIG. 1) of system 100 (FIG. 1). However, it should be understood that LDPC encoder 106 and LDPC decoder 114 may use any other suitable LDPC code instead of or in addition to parity check matrix 201, which may or may not be quasi-cyclic. As a quasi-cyclic parity check matrix, parity check matrix 201 is composed of a plurality of Z×Z blocks, sometimes referred to as circulants. In FIG. 2, each entry in parity check matrix 201 represents a circulant, where Z=16. Each circulant in parity check matrix 201 may be a 16×16 zero matrix (e.g., matrix of all zeros), a 16×16 identity matrix, or a 16×16 identity matrix shifted by some amount. Therefore, parity check matrix 201 may be represented in the form shown in FIG. 2, in which each entry representing a circulant is a number between −1 and 15 to indicate a zero matrix (in the case of a −1) or the amount that a 16×16 identity matrix is shifted. For example, entry 210 of parity check matrix 201 represents a 16×16 identity matrix that has been shifted by three positions. The actual value of entry 210 is illustrated in FIG. 3. This compressed representation of a quasi-cyclic parity check matrix shown in FIG. 2 allows a QC-LDPC coding system, such as that illustrated in FIG. 1, to store a quasi-cyclic parity check matrix using little memory.

With continued reference to FIG. 2, parity check matrix 201 is a matrix with 10×5 circulants, where each circulant is a 16×16 matrix. Thus, parity check matrix 201 is actually a 160×80 parity check matrix. Similarly, codeword vector 205 has a total of ten components, where each component is multiplied a circulant in equation 200. Thus, codeword vector 205 is a 160-bit vector with 96 bits of user information and 64 parity bits. For simplicity, each Z-bit component in codeword vector 205 may be referred to as a symbol. The Z-bit components in parity sub-vector 206 may sometimes be referred to as a parity symbol. Also, for simplicity and clarity in describing the various embodiments of the present invention, the parity symbols in parity sub-vector 206 may sometimes be referred to as being in a parity sequence (or simply a sequence), the parity sequence starting at $p_0$ and ending at $p_{n-1}$, where n may refer to the total number of parity symbols in the sequence (e.g., n=4 in the example of FIG. 3).

Since codeword vector 205 is composed of a data portion and a parity portion, parity check matrix 201 may also be represented by a data portion (or the A matrix) and a parity portion (or the B matrix). The A matrix includes the circulants in parity check matrix 201 that are multiplied by data symbols in data sub-vector 206 in equation 200, while the B matrix includes the circulants in parity check matrix 201 that are multiplied by parity symbols in parity sub-vector 208.

Figure 4:
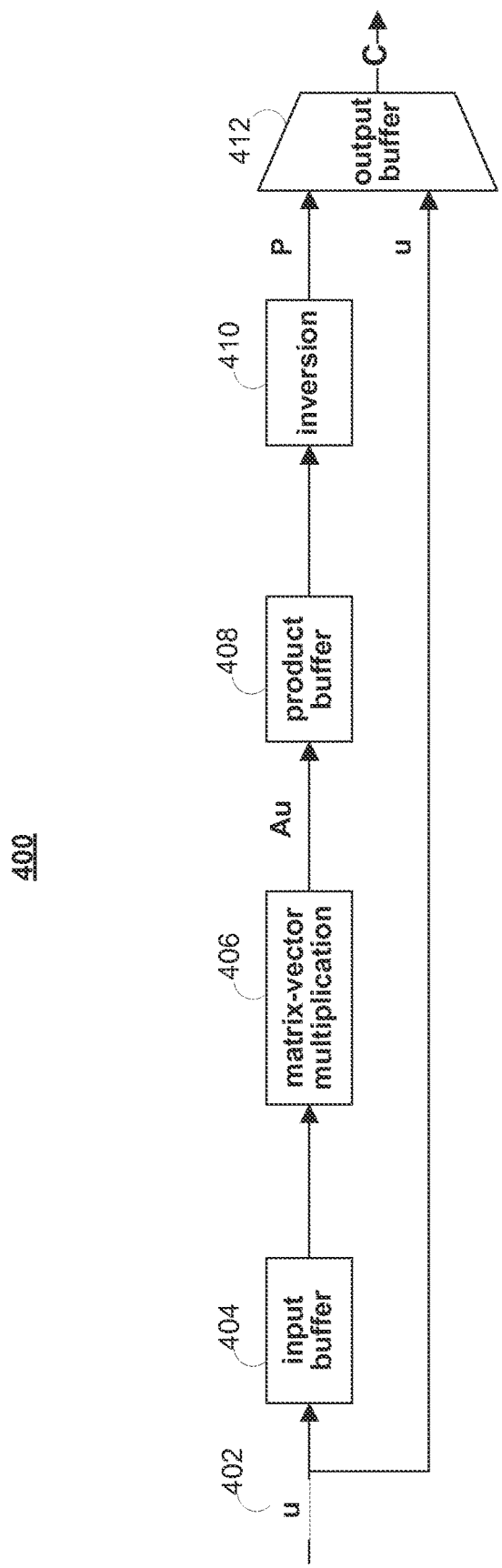
FIG. 4 is a simplified block diagram of an LDPC encoder.

Referring now to FIG. 4, and with continued reference to FIGS. 1 and 2, a simplified block diagram of LDPC encoder 400 is shown, which may be a more detailed view of LDPC encoder 106. LDPC encoder 400 includes input buffer 404, matrix-vector multiplication unit 406, product buffer 408, inversion unit 410, and output buffer 412. In these embodiments, these components may be configured to generate parity symbols from user information 402 in accordance with LDPC coding equation 200 of FIG. 2. Thus, for simplicity, LDPC encoder 400 will sometimes be described as employing an LDPC code with a parity check matrix given by parity check matrix 201 of FIG. 2. It should be understood, however, that this is for clarity purposes and not intended to limit the present invention.

User information 402 may first be buffered in input buffer 402. Input buffer 402 may be any suitable type of memory component, such as a suitable RAM or FLASH-based storage system. Input buffer 404 may also be of any suitable size, and is preferably able to store at least two user information vectors. Matrix-vector multiplication unit 406 may retrieve user information 402 from input buffer 404, and may multiply user information 402 by the data portion, the A matrix, of parity check matrix 201 of FIG. 2. The resulting product may sometimes be referred to as an intermediate vector, an intermediate product, or simply by the variable x. Mathematically, matrix-vector multiplication unit 406 computes, $$Au=x \qquad (EQ. 1)$$

Because the A matrix is sparse for LDPC codes, matrix-vector multiplication unit 406 may compute EQ. 1 with low complexity.

The intermediate vector generated by matrix-vector multiplication unit 406 is then buffered in product buffer 408. Product buffer 408 may be implemented using any suitable type of storage medium (e.g., RAM, FLASH, etc.) and may be of any suitable size (e.g., large enough to store two intermediate vectors).

The multiplication performed by matrix-vector multiplication unit 406 may partially complete the matrix-vector multiplication shown by LDPC coding equation 200 of FIG. 2. Once the matrix-vector multiplication of FIG. 2 is complete, the equation dictates that the resulting vector will be the zero vector. For this to result to occur, EQ. 2 below should hold.

$$Bp=Au=x \qquad (EQ. 2)$$

In EQ. 2, B is the parity portion of parity check matrix 201 (FIG. 2) and p is parity sub-vector 208 (FIG. 2).

Inversion unit 410 may retrieve the intermediate vector, x, from product buffer 408. Using a suitable one of a plurality of inversion mechanisms, inversion unit 410 may divide the intermediate vector by the parity portion of parity check matrix 201. Various inversion mechanisms that inversion unit 410 may employ will be described in detail below. Mathematically, inversion unit 410 produces $$p=x/B, \qquad (EQ. 3)$$

and therefore the output of inversion unit 410 is the parity symbols of parity sub-vector 208 (FIG. 2). Output buffer 412 then buffers the parity symbols generated by inversion unit 410, along with the original user information 402 corresponding to these parity symbols. In this way, output buffer 412 can concatenate user information 402 to the generated parity symbols, which produces a codeword in accordance with the LDPC code.

In some embodiments, inversion unit 410 may be constructed to operate using a plurality of different inversion mechanisms. Each inversion mechanism may be particularly suitable or designed especially for the properties of a particular type of B matrix in a parity check matrix. Thus, in some embodiments, each inversion mechanism may compute EQ. 3 above using a different mathematical concept or idea, and may require different operations or sequences of operations.

In some embodiments, inversion unit 410 may retrieve the inverse of the B matrix (that is, $B^{-1}$) from a memory, such as ROM (not shown). Inversion unit 410 may then directly multiply the intermediate vector stored in product buffer 408 with the stored inverse to produce the appropriate parity symbols. A matrix-vector multiplication used in this inversion mechanism has a running time of $O(n^2)$ for an n×n B matrix, which may be large for LDPC codes with large parity check matrices. Therefore, inversion unit 410 may be configured to select this inversion mechanism for LDPC codes having a small parity check matrix, and therefore a small $B^{-1}$ matrix.

Optionally, inversion unit 410 uses a recursion-based inversion mechanism for LDPC codes having a dual-diagonal B matrix. An example of a dual-diagonal B matrix is shown in the approved drafts of the 802.11n standard, which is reproduced in part as B in FIG. 5. Various recursive inversion mechanisms for computing the parity symbols in P (FIG. 5) for a QC-LDPC codeword are described in the above-incorporated U.S. application Ser. No. 12/024,720, titled "LOW LATENCY PROGRAMMABLE ENCODER WITH OUTER SYSTEMATIC CODE AND LOW-DENSITY PARITY-CHECK CODE," filed Feb. 1, 2008. Inversion unit 410 may employ one or more of the recursive-based inversion operations disclosed in this incorporated application.

Figure 6:
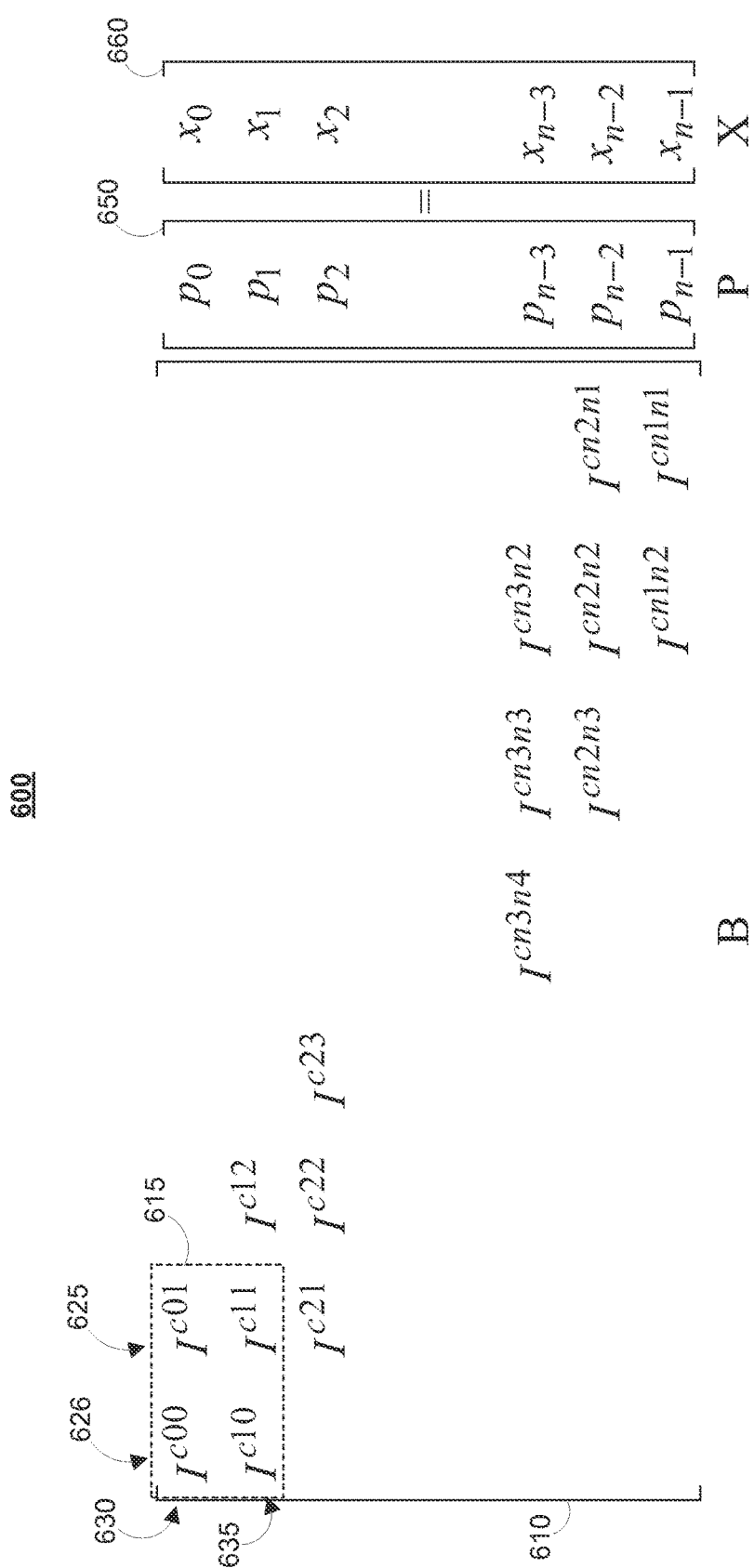
FIG. 6 is a partial LDPC coding equation based on a quasi-cyclic parity check matrix with a tri-diagonal parity portion.

Referring now to FIG. 6, and with continued reference to FIG. 4, partial LPDC coding equation 600 is shown in which tri-diagonal B matrix 610 is shown. A tri-diagonal matrix may refer to any matrix that has a non-zero diagonal, as well as a non-zero component at each location directly above and below a diagonal component (except at the corners of the diagonal). Each component may be a block of any suitable size or dimension, such as the circulant size, Z×Z. Inversion unit 410 may operate using a tri-diagonal matrix with any number of such components. In FIG. 6, the tri-diagonal components of tri-diagonal matrix 610 are each identity matrices, I, or identity matrices that are shifted by some amount. The amount that an identity matrix is shifted is shown as a subscript. For example, $I^{c00}$ (in the upper left corner of matrix 610) is an identity matrix shifted by c00. The superscript, c00, or any other such superscript, may sometimes be referred to as a shift coefficient. Empty entries in B matrix 610 are zero matrices.

When shift coefficients c00, c01, c10, c11, cn1n1, cn2n2, cn1n2, and cn2n1 are equal to zero, inversion unit 410 may directly compute two of the n parity symbols in parity vector 650 using the intermediate vector, x. In particular, clearly from the multiplications associated with the first two and last two rows of matrix 610 in equation 600, inversion unit 610 may compute the actual values of $p_2$ and $p_{n-3}$ according to, $$p_2=x_0+x_1, \text{ and} \qquad (EQ. 4)$$

$$p_{n-3}=x_{n-1}+x_{n-2}. \qquad (EQ. 5)$$

Also, from the multiplications associated with any row of matrix 610 in equation 600 (other than the top two or bottom two rows), and setting the shift coefficients to zero, the following equation may be derived:

$$p_i=p_{i+1}+p_{i+2}+x_{i+1}, \forall i<n-3. \qquad (EQ. 6)$$

Most of the parity symbols, therefore, can be computed recursively using one symbol of x (which is an input to inversion unit 410) and the value of the next two parity symbols in the sequence. In particular, inversion unit 410 may be configured to initiate a recursion at substantially the end of the parity sequence. Inversion unit 410 may then recursively compute a plurality of parity symbols, and eventually terminate the recursion at substantially the start of the sequence.

As previously described, EQ. 6, the equations based off of EQ. 6, as well as other equations below, are derived by setting all of the shift coefficients in B matrix 610 to zero. This, however, is merely illustrative and intended to simplify the description of the present invention, not to limit the present invention. In fact, recursion computations similar to that of EQ. 6 can be used for any suitable set of shift coefficients, as long as the shift coefficients for c00, c01, c10, c11, cn1n1, cn2n2, cn1n2, and cn2n1 are equal to zero.

Inversion unit 410 can compute one parity symbol that is substantially at the end of the parity sequence—namely, $p_{n-3}$ using EQ. 4 above—to start the recursion defined by EQ. 6. However, inversion unit 410 also needs the value of an adjacent parity symbol, such as the value of $p_{n-2}$, to initiate the recursive computations. Since the actual value of the adjacent parity symbol is not available, inversion unit 410 initiates the recursion using a speculative value for the adjacent parity symbol. An actual value for a parity symbol refers to a symbol value that is in accordance with the LDPC code, and may eventually be outputted as part of the codeword. A speculative value for a parity symbol refers to a symbol value that is temporarily used as the symbol value for a parity symbol, and may not be in accordance with the LDPC code. Inversion unit 410 may use a speculative value of zero for the last parity symbol in the sequence, e.g., $$p'_{n-1}=0 \qquad (\text{EQ. 7})$$

to compute a symbol value for an adjacent parity symbol according to, $$p'_{n-2}=p_{n-3}+p'_{n-1}+x_{n-2} \qquad (\text{EQ. 8})$$

$$=x_{n-1}+x_{n-2}+x_{n-2} \qquad (\text{EQ. 9})$$

$$=x_{n-1} \qquad (\text{EQ. 10})$$

where EQ. 8 is obtained from rearranging EQ. 6 and setting i to n−3. For clarity, a parity symbol with an apostrophe (') indicates that the value of that parity symbol is a speculative value. Therefore, as shown above, inversion unit 410 produces speculative values for the last parity symbols in the sequence so that inversion unit 410 can start the recursion defined by EQ. 6.

Using the actual value of $p_{n-3}$ and the speculative value of $p_{n-2}$, inversion unit 410 can compute a speculative value for $p_{n-4}$, and can continue to compute symbol values for the remaining parity symbols until inversion unit 410 substantially reaches the beginning of the sequence. During the recursive computations, a speculative value for $p_2$ (or $p'_2$) may be computed. Inversion unit 410 may compare the speculative value for this parity symbol to the actual value of this parity symbol, which inversion unit 410 may calculate according to EQ. 4.

Note that, by initially setting the symbol value of the last parity symbol in the sequence to zero, each speculative value computed in the recursion (including $p'_2$) needs to be converted to an actual value by correcting the speculative value by the actual value of $p_{n-1}$. The speculative and actual values of $p_2$ are therefore related according to, $$p_2=p'_2+p_{n-1}. \qquad (\text{EQ. 11})$$

The actual value of the last parity symbol may be referred to as a correction factor, c, which inversion unit 410 can use to convert the speculative value of a parity symbol into the actual value for that parity symbol. Inversion unit 410 therefore computes, $$c=p'_2+p_2, \qquad (\text{EQ. 12})$$

and uses the correction factor to correct each speculative value. In particular, inversion unit 410 uses the correction factor to execute $$p_i=p'_i+c \qquad (\text{EQ. 13})$$

For any parity symbol for which a speculative value was generated in the recursion (or otherwise).

In some embodiments, inversion unit 410 may start the recursive computations for parity symbols at substantially the beginning of the parity sequence instead of at substantially the end. In particular, inversion unit 410 may initially use the actual value of $p_2$ and a speculative value for $p_1$ (e.g., $p'_1=0$) to start the recursion, and may compare the speculative value of $p_{n-3}$ (or $p'_{n-3}$) computed from the recursion to the actual value of $p_{n-3}$ in order to obtain the correction factor. In these embodiments, inversion unit 410 may recursively compute, $$p_{i+2}=p_{i+1}+p_i+x_{i+1}, \forall i>2, \qquad (\text{EQ. 14})$$

where some of symbol values may be speculative values, to obtain symbol values for the remaining parity symbols in the sequence.

The recursive process performed by inversion unit 410, whether initiated at the beginning or at the end of the parity sequence, may produce speculative values of some of the parity symbols and actual values of the other parity symbols. For example, in embodiments where inversion unit 410 recursively computes parity symbols according EQ. 14, the first three computations that inversion unit 410 performs are:

$$p_3=p_1+p_2+x_2 \qquad (\text{EQ. 15})$$

$$p_4=p_2+p_3+x_3 \qquad (\text{EQ. 16})$$

$$p_5=p_3+p_4+x_4. \qquad (\text{EQ. 17})$$

Using a speculative value for $p_1$ to initiate the recursion, EQ. 15 through EQ. 17 becomes:

$$p'_3=p'_1+p_2+x_2 \qquad (\text{EQ. 18})$$

$$p'_4=p_2+p'_3+X_3 \qquad (\text{EQ. 19})$$

$$p_5=p'_4+p'_3+x_4. \qquad (\text{EQ. 20})$$

Inversion unit 410 therefore produces two speculative values and one actual value in the first three computations of the recursion. This is because the first two computations are off by a correction factor, while the third equation includes two speculative values that effectively cancel each other out.

Generalizing EQ. 18 through EQ. 20, inversion unit 410 computes the following three equations to obtain symbol values for parity symbols in the parity sequence:

$$p'_{3i}=p_{3i-1}+p'_{3i-2}+x_{3i-1} \qquad (\text{EQ. 21})$$

$$p'_{3i+1}=p_{3i}+p'_{3i-1}+x_{3i} \qquad (\text{EQ. 22})$$

$$p'_{3i+2}=p_{3i+1}+p'_{3i}+x_{3i+1} \qquad (\text{EQ. 23})$$

Inversion unit 410 can convert the speculative values computed according to EQ. 21 or EQ. 22 when the parity check matrix for the employed LDPC is chosen such that a speculative value is computed for $p_{n-3}$, instead of the actual value. This way, inversion unit 410 may obtain a correction factor by comparing this speculative value with the actual value (given by EQ. 5). In some embodiments, this constraint is met by using a parity check matrix having a size that allows the speculative symbol value of $p_{n-3}$ to be computed based on either EQ. 21 or EQ. 22. In these embodiments, LDPC encoder 400 operates using a parity check matrix with a column length of n=3j or n=3j+1.

As described above, inversion unit 410 can compute actual and speculative values for parity symbols using a recursion starting from the beginning or from the end of the parity sequence. In some embodiments, inversion unit 410 may initiate the recursion at both the beginning and at the end of the parity sequence, and can compute the recursions concurrently. For example, inversion unit 410 may compute symbol values for $p_3$ and $p_{n-3}$ concurrently, for $p_4$ and $p_{n-4}$ concurrently, etc. Inversion unit 410 may then terminate each recursion at substantially the middle point in the recursion, e.g., once speculative or actual values are computed for each parity symbol. In these embodiments, the computation time for computing symbol values may be advantageously reduced by approximately half. Although the recursion can be initiated at the beginning of the parity sequence only, at the end of the parity sequence only, or at both the beginning and the end of the sequence, for simplicity, various embodiments of the present invention will be described for scenarios where the recursion is initiated only at the beginning of the sequence.

In some embodiments, LDPC encoder 400 employs a QC-LDPC code having a parity check matrix with a parity portion similar to the tri-diagonal matrix of FIG. 6, except that the tri-diagonal matrix includes additional non-zero circulants. An example of such a B matrix is shown in FIG. 7, which shows B matrix 710 with non-zero circulants 715 and 720 that are not located along the tri-diagonal of B matrix 710. Non-zero circulants 715 and 720 are preferably positioned in the first two columns of B matrix 710 in any suitable row, m. These extra circulants increase the weight of the first two columns from two and three to three and four, respectively. Typically, columns with a weight of two have a significant negative impact on the error floor. Therefore, the additional non-zero circulants 715 and 720 advantageously remove this negative impact.

It should be understood that non-zero circulants 715 and 720 can be placed in any suitable row of B matrix 710. Also, non-zero circulants may be positioned in the last two columns of B matrix 710 in addition to or instead of non-zero circulants 715 and 720. This would increase the weight of the last column from two to three, thereby advantageously decreasing the error floor. In embodiments where non-zero circulants are placed in the first two and last two columns, these circulants may be positioned in the same row or different rows. Moreover, even though the embodiments of the present invention are described in terms of including pairs of extra circulants in a B matrix (e.g., circulants 715 and 720), it should be understood that this is merely advantageous for the particular examples described herein, and that the present invention is not limited to this approach. For simplicity in describing the principles of the present invention, and not by way of limitation, the embodiments of the present invention will primarily be described for the case where non-zero circulants are added only to the first two columns.

Figure 8:
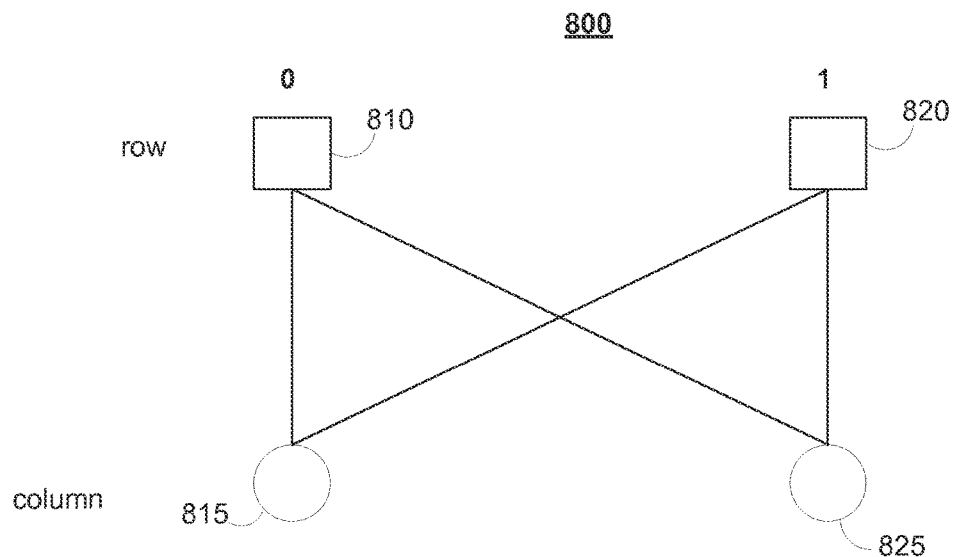
FIG. 8 is a graphical representation of a cycle that is formed in a tri-diagonal parity portion when no additional non-zero circulants are present.

In addition to increasing the weight of the first column, non-zero circulants 715 and 720 advantageously reduce the negative impact of the short cycle that would have been present due to the four upper-left corner circulants (e.g., the equivalent circulants in region 615 of FIG. 6). Turning to FIG. 8, a graphical representation of the cycle of region 615 (FIG. 6) is illustrated. In particular, graphical representation 800 illustrates the cycle formed when non-zero circulants are located only along the tri-diagonal of the B matrix. Graphical representation 800 is a sub-graph of a Tanner graph for the LDPC code employed by the LDPC encoder. Squares 810 and 820 of graphical representation 800 represent the first and second rows of the tri-diagonal B matrix, respectively, while circles 815 and 825 represent the first and second columns of the tri-diagonal B matrix. The lines between squares 810 and 820 and circles 815 and 825 indicate that non-zero circulants present at the corresponding locations in the B matrix.

The lines between squares 810 and 820 and circles 815 and 825 illustrate the formation of Z cycles of length 4. A cycle this short may be highly undesirable, as the high dependence between nodes 815 and 825 may make some combinations of errors uncorrectable, thereby increasing the error floor. By using a tri-diagonal matrix with additional circulants as the B matrix, inversion unit 410 (FIG. 4) may alleviate the negative effects of the cycle.

Figure 9:
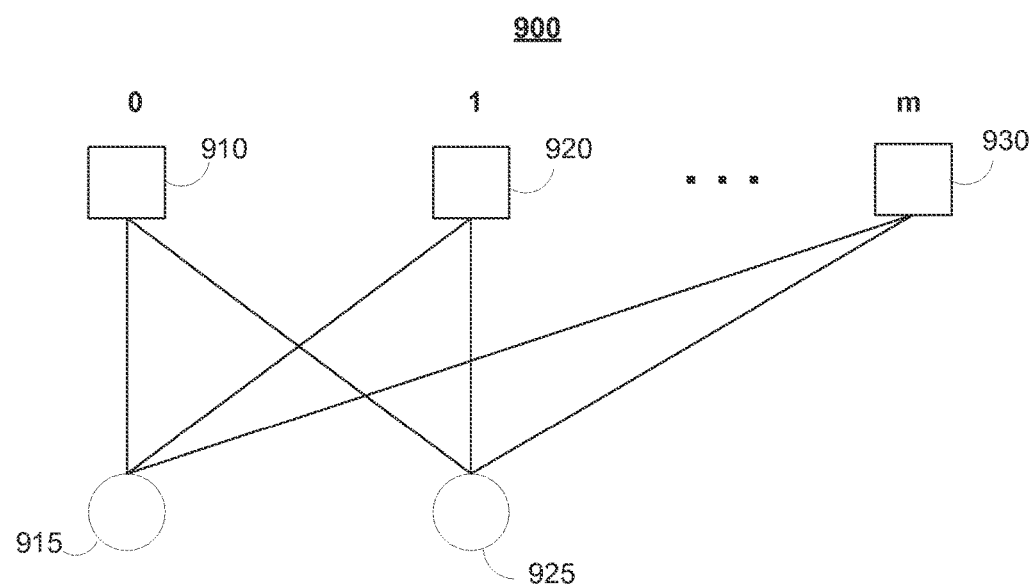
FIG. 9 is a graphical representation of a tri-diagonal parity portion when two additional non-zero circulants are present in the mth row of a B matrix.

FIG. 9 shows graphical representation 900, which illustrates a partial Tanner graph for an LDPC code having B matrix 710 (FIG. 7). Graphical representation 900 is similar to graphical representation 800 (FIG. 8) except that graphical representation 900 includes square 930 representing the mth row of B matrix 710 (FIG. 7). The two non-zero circulants in this row (e.g., circulants 715 and 720) account for the lines between circles 915 and 925 and square 930. The non-zero circulants 715 and 720 therefore increase the degree of both circles 915 and 925. That is, the number of lines extending from circles 915 and 925 (e.g., three each) increases from that shown in FIG. 8 (e.g., two each). This increases the value of the approximated cycle EMD (ACE) metric for the LDPC code, which is a measure of the degree of a cycle, resulting in a lower error floor for the LDPC code. Similar and/or additional improvements on the error floor may be achieved by including non-zero circulants in the last two columns of the B matrix. Thus, as illustrated in FIGS. 8 and 9, to ensure a higher decoding performance, an LDPC encoder (e.g., LDPC encoder 106 (FIG. 1) or LDPC encoder 400 (FIG. 4)) may perform encoding using an LDPC code with a tri-diagonal B matrix with additional non-zero circulants.

With continued reference to FIGS. 4, 6 and 7, inversion unit 410 may compute parity symbols using the speculative recursion and correction technique described above, even when inversion unit 410 operates based on a parity check matrix with B matrix 710. Inversion unit 410 may perform the speculative recursion in the same manner as that described above, but using a slightly modified equation for the mth row to adjust for the additional non-zero circulants. For example, in embodiments where inversion unit 410 starts the inversion from the beginning of the parity sequence, inversion unit 410 may compute EQ. 21 through EQ. 23 until the recursion reaches the mth parity symbol. For the mth parity symbol, inversion unit 410 computes, $$p_m = p_0 + p_1 + p_{m-1} + p_{m-2} + x_{m-1}, \qquad (EQ.\ 24)$$

where the first two terms are due to circulants 715 and 720 in B matrix 700 (FIG. 7). As shown in FIG. 6, $p_0 + p_1 = x_0$. Thus, EQ. 24 can be reduced to:

$$p_m = x_0 + p_{m-1} + p_{m-2} + X_{m-1}. \qquad (EQ.\ 25)$$

Therefore, inversion unit 410 may compute the mth parity symbol using a similar equation as for the case where additional circulants are not included. Depending on which row the circulants 715 and 720 are located, one or both of the previous parity symbols in EQ. 25 may be speculative values. Therefore, inversion unit 410 may actually be computing one of the following equations for the mth position in the recursion:

$$p'_m = x_0 + p_{m-1} + p'_{m-2} + x_{m-1} \qquad (EQ.\ 26)$$

$$p'_m = x_0 + p'_{m-1} + p_{m-2} + x_{m-1} \qquad (EQ.\ 27)$$

$$p_m = x_0 + p'_{m-1} + p'_{m-2} + x_{m-1} \qquad (EQ.\ 28)$$

Inversion unit 410 may then complete the recursion, obtain a correction factor, and convert the speculative values to actual values, as described above.

In some embodiments, additional non-zero circulants may be present in the B matrix in the last two columns at some row m instead of the first two columns. In these embodiments, inversion unit 410 may modify the equation computed in the recursion for the mth row in a different manner. For example, in embodiments where inversion unit 410 starts the inversion from the beginning of the parity sequence, inversion unit 410 may compute EQ. 21 through EQ. 23 until the recursion reaches the mth parity symbol. For the mth parity symbol, inversion unit 410 computes, $$p_m = p_{m-1} + p_{m-2} + x_{m-1} + p_{n-2} + p_{n-1}, \quad \text{(EQ-29)}$$

where the last two terms are due to additional non-zero circulants. As shown in FIG. 6, $p_{n-2} + p_{n-1} = x_{n-1}$, Thus, EQ. 29 can be reduced to:

$$p_m = p_{m-1} + p_{m-2} + x_{m-1} + x_{n-1}. \quad \text{(EQ. 30)}$$

Again, depending on the row m, some of the symbol values for the parity symbols in EQ. 30 may be speculative values.

In some embodiments, non-zero circulants outside of the tri-diagonal may be present in the first two columns as well as the last two columns. The circulants in the first two columns may be in the same row as the circulants in the last columns, or the circulants may be in a different row. For embodiments where the circulants are in different rows, inversion unit 410 may perform the recursion with one equation modified as shown in EQ. 25 and another equation modified as shown in EQ. 30. For embodiments where all of the non-zero circulants are in the same row, inversion unit 410 may perform the recursion with one modified equation. In particular, for the mth row, inversion unit 410 can compute, $$p_m = x_0 + p_{m-1} + p_{m-2} + x_{m-1} + x_{n-1}, \quad \text{(EQ. 31)}$$

where the first term in EQ. 31 is derived from the circulants in the first two columns and the last term in EQ. 31 is derived from the circulants in the last two columns. At the completion of the recursion, inversion unit 410 may obtain a correction factor and correct all of the speculative values, as described previously.

It should be understood that more than one pair of additional non-zero circulants may be present in the first two columns, and more than one pair of additional non-zero circulants may be present in the last two columns. In these embodiments, inversion unit 410 (FIG. 4) may compute the recursion with modified equations for each row with additional circulants.

As described above, the B matrix of a parity check matrix may need to have a column size of n=3j or n=3j+1 to ensure that the recursion computes a speculative value for $p_2$ or $p_{n-3}$. In some embodiments, by adding non-zero circulants at certain positions in a B matrix, inversion unit 410 may use the speculative recursion and correction technique for a B matrix with a column size of n=3j+2. Therefore, it should be understood that the speculative recursion and correction approach is not limited to parity check matrices of any particular size. For example, a non-zero circulant may be placed in the second column of the fourth row. This changes the recursive equation for the fourth row from $$p'_4 = p_2 + p'_3 + x_3, \quad \text{(EQ. 32)}$$

reproduced from EQ. 19, to $$p_4 = p'_1 + p_2 + p'_3 + x_3. \quad \text{(EQ. 33)}$$

The circulant therefore changes which parity symbols have actual values (and which have speculative values) computed in the recursion. In particular, inversion unit 410 now computes the following equations in the recursion:

$$p'_{3i} = p'_{3i-1} + p_{3i-2} + x_{3i-1} \quad \text{(EQ. 34)}$$

$$p_{3i+1} = p'_{3i} + p'_{3i-1} + x_{3i} \quad \text{(EQ. 35)}$$

$$p'_{3i+2} = p_{3i+1} + p'_{3i} + x_{3i+1} \quad \text{(EQ. 36)}$$

In these embodiments, the parity check matrix of the QC-LDPC code may have a columns size of n=3j+1 or n=3j+2.

Figure 10:
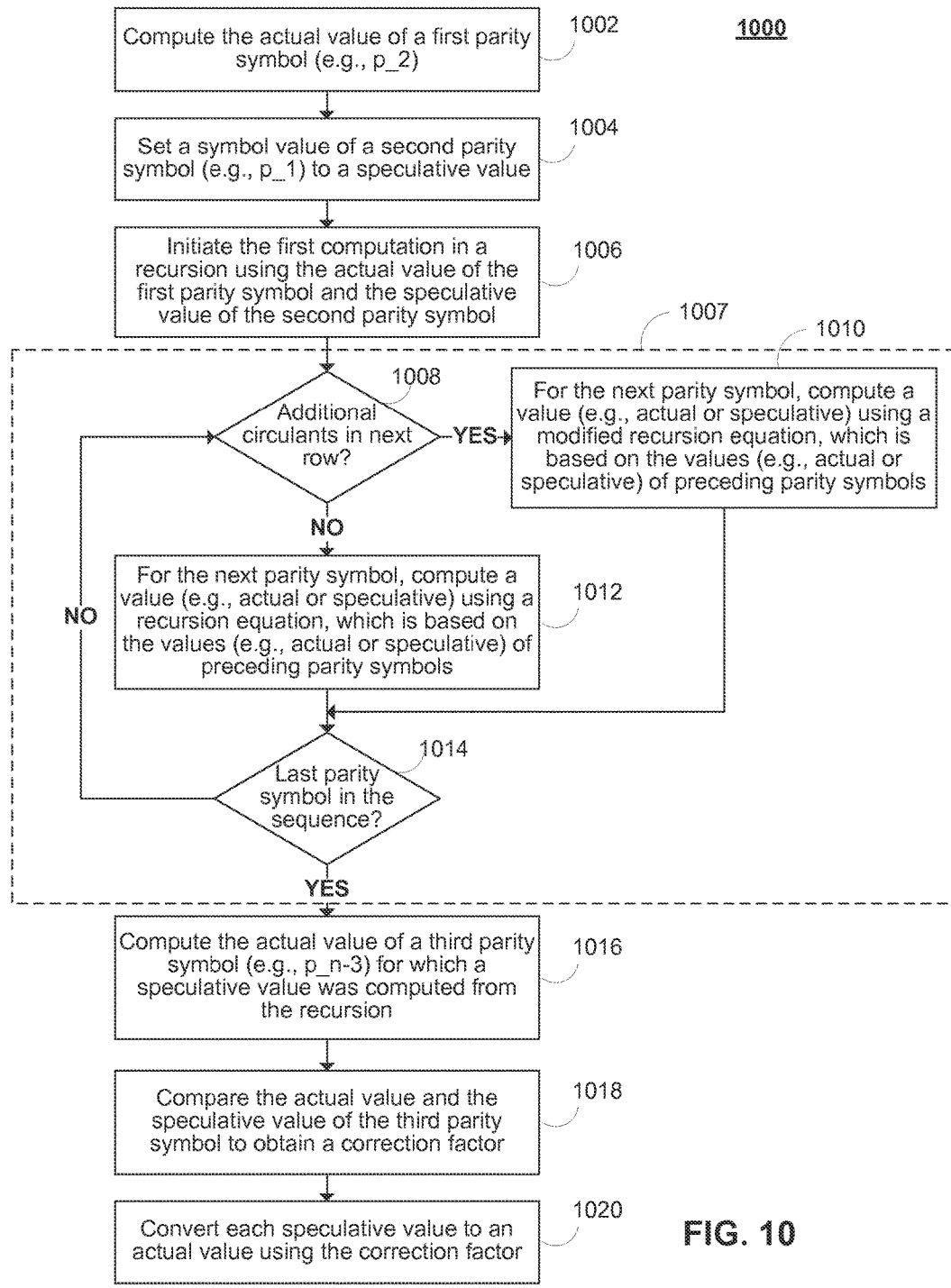
FIG. 10 is a flowchart of a process for recursively computing parity symbols using speculative values and correcting the speculative values.

Referring now to FIG. 10, a flowchart of illustrative process 1000 is shown for recursively computing parity symbols using speculative values for tri-diagonal B matrices, and then correcting the speculative values to obtain the corresponding actual values. Process 1000 may be executed by any suitable inversion unit of an LDPC encoder, such as inversion unit 410 of FIG. 4. Process 1000 begins at step 1002 in which the inversion unit computes the actual value of a first parity symbol. For example, the inversion unit can compute the actual value of $p_2$ based on EQ. 4. Then, at step 1004, the inversion unit may set the symbol value for a second parity symbol to a speculative value. The second parity symbol may be an adjacent parity symbol in a parity sequence (e.g., $p_1$), and can be used to initiate a recursion. That is, by setting the second parity symbol to a speculative value, the inversion unit may perform a recursion that computes the symbol value for a parity symbol based on the symbol values of two previous parity symbols in the sequence. Thus, at step 1006, the inversion unit may initiate the first computation of the recursion using the actual value of the first parity symbol and the speculative value of the second parity symbol.

The inversion unit may continue the recursion by performing the steps shown within region 1007. At step 1008, the inversion unit may determine whether additional non-zero circulants are present in the next row of the B matrix outside of its tri-diagonal. For example, the inversion unit may determine whether non-zero circulants are positioned in the first two columns of the B matrix or in the last two columns of the B matrix. If additional circulants are present, the inversion unit may compute a symbol value for the next parity symbol (e.g., a speculative or an actual value) using a modified recursion equation at step 1010. That is, the equation used by the inversion unit may be modified compared to the first computation in the recursion. Otherwise, process 1000 may continue to step 1012, where the inversion unit may compute the symbol value for the next parity symbol (e.g., a speculative or an actual value) using the same or substantially the same recursion equation.

At step 1014, the inversion unit 1014 may determine whether a symbol value has been computed for each parity symbol in the sequence. If not, process 1000 may return to step 1008 so that the inversion unit may compute a symbol value for the next parity symbol in the parity sequence. If, at step 1014, the inversion unit determines that symbol values have been computed for all relevant parity symbols, the inversion unit may terminate the recursion, and process 1000 may continue to step 1016. At step 1016, the inversion unit may compute the actual value of a third parity symbol (e.g., $p_{n-2}$) for which a speculative value was computed in the recursion. The inversion unit may then compare the actual value of the third parity symbol to its speculative value at step 1018 to obtain a correction factor. At step 1020, the inversion unit may convert each speculative value computed in the recursion (or otherwise) to corresponding actual values using the correction factor. Thus, using the steps of process 1000, the inversion unit may compute actual values for each parity symbol in accordance with a QC-LDPC code having a tri-diagonal B matrix.

It should be understood that the steps of process 1000 are merely illustrative. Any of the steps may be removed, modified, or combined, or any steps may be added, without departing from the scope of the present invention. Further-more, the steps of process 1000 are shown for a recursion that uses the values of two previous parity symbols to compute a next parity symbol, and is initiated using one actual value and one speculative value. It should be understood that the present invention may be applied to recursions that use a different number of parity symbols, and where the recursion can be initiated with any suitable number of speculative values.

In some embodiments of the present invention, an inversion unit for an LDPC encoder (e.g., inversion unit 410 of FIG. 4) may compute parity symbols using a blockwise inversion mechanism. In particular, inversion unit 410 may partition the B matrix into blocks, where at least one of the blocks includes a plurality of circulants, and can compute the inversion using the blocks. Inversion unit 410 may use the blockwise inversion mechanism with LDPC codes that have B matrices other than just tri-diagonal or dual-diagonal matrices. Therefore, the blockwise inversion mechanism may allow for more flexible LDPC code designs. However, to ensure that the inversion can be computed with low computational complexity, one of the larger blocks in the B matrix may be a upper triangular, lower triangular, or a diagonal matrix.

Inversion unit 410 (FIG. 4) may perform the blockwise inversion mechanism using the following known equation:

$$\begin{bmatrix} a & b \\ c & d \end{bmatrix}^{-1} = \begin{bmatrix} a^{-1} + a^{-1}b(d - ca^{-1}b)^{-1}ca^{-1} & -a^{-1}b(d-ca^{-1}b)^{-1} \\ -(d-ca^{-1}b)^{-1}ca^{-1} & (d-ca^{-1}b)^{-1} \end{bmatrix}. \quad (EQ. 37)$$

In EQ. 37, a, b, c, and d may be matrix blocks that together compose the parity portion of the parity check matrix. For simplicity, the number of rows in blocks a and b may be referred to by the variable s, and the number of rows in blocks c and d may be referred to by the variable g. Blocks a, b, c, and d may be of any suitable dimension. Therefore, s, g, and the remaining dimensions and properties of these matrix blocks may be designed such that the blockwise inversion mechanism has low complexity.

An inversion operation is generally a resource-intensive operation. Looking at EQ. 37, two matrix components on the right side of the equation need to be inverted and multiplied by another component in order to invert the overall matrix on the right side, e.g., a and $(d-ca^{-1}b)$. By designing the parity check matrix such that a is an upper triangular, lower triangular, or diagonal matrix, inversion unit 410 (FIG. 4) may multiply the inverse of a with another component in linear time using a back substitution approach. In these embodiments, the complexity of the computation may be low even when a is a large matrix (e.g., s>>g). Moreover, with a larger a matrix, $(d-ca^{-1}b)$ may be a small matrix. Therefore, the inverse of this small matrix may be stored and later retrieved when inversion unit 410 computes EQ. 37.

Figure 11:
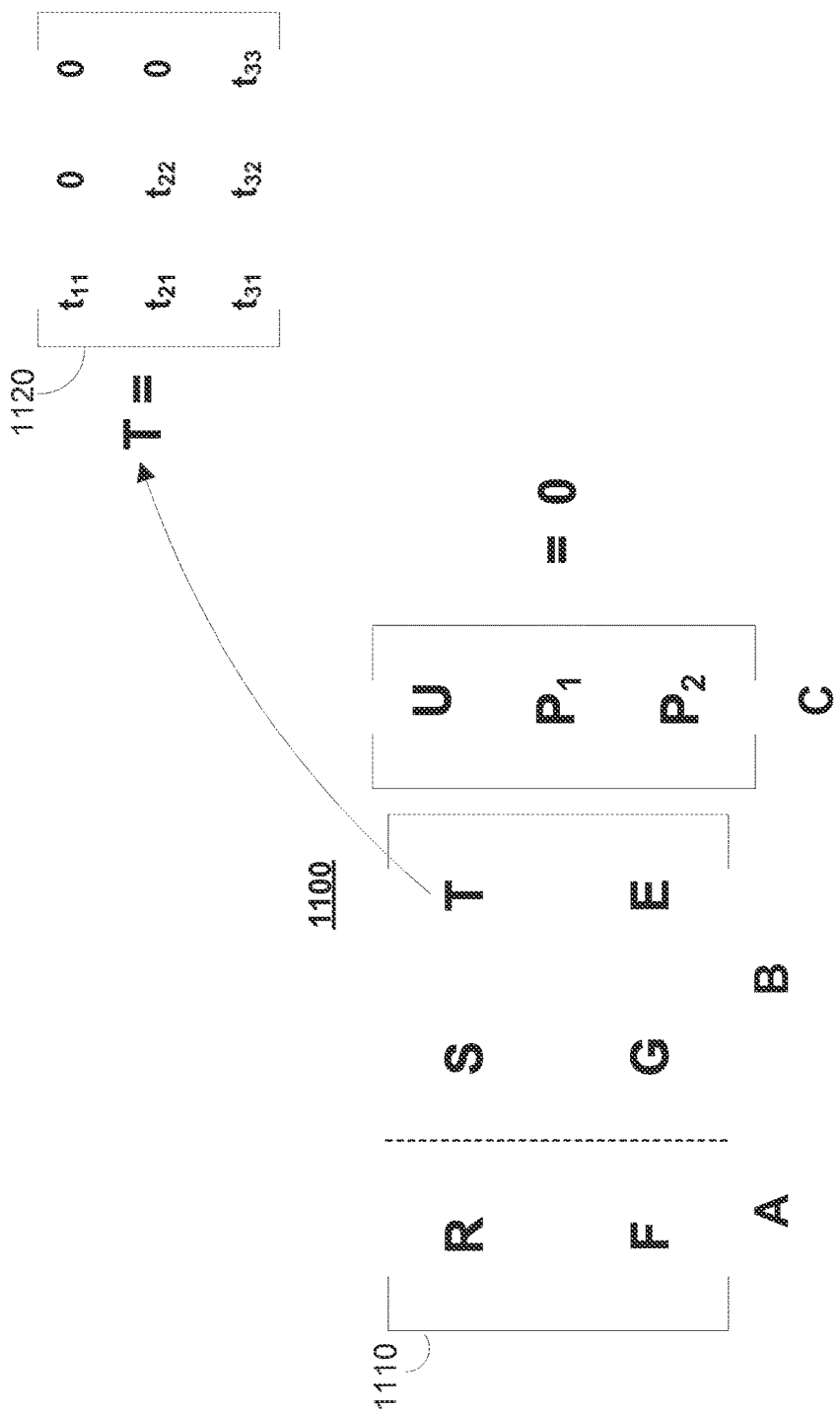
FIG. 11 is an LDPC coding equation based on LDPC code with a B matrix having a lower triangular matrix.

As described above, inversion unit 410 may obtain parity symbols with low complexity, especially when the parity check matrix has a B matrix with a large triangular block. An example of the operation of inversion unit 410 will now be described for the parity check matrix shown in FIG. 11. FIG. 11 shows LDPC coding equation 1100 with a parity check matrix 1110 that is composed of six blocks: R, S, T, F, G, and E. The R and F blocks make up the A matrix of the parity check matrix, while the S, T, G, and E blocks make up the B matrix of the parity check matrix. Each of these blocks may have dimensions of any suitable size, where the R, S, and T blocks have s rows and the F, G, and E blocks have g rows. Generally, increasing s and decreasing g increases the efficiency of the LDPC encoder. To illustrate this, in the following example, s is set to three and T is a lower triangular matrix, as shown by matrix 1120 in FIG. 11.

For LDPC encoding equation 1100, the two parity check equations are:

$$Ru + Sp_1 + Tp_2 = 0 \quad (EQ. 38)$$

$$Fu + Gp_1 + Ep_2 = 0 \quad (EQ. 39)$$

where u is a user bit (e.g., user information 102 of FIG. 1), and $p_1$ and $p_2$ are parity bits. Substituting $p_2$ from EQ. 38 into EQ. 39, EQ. 40 below is obtained:

$$(ET^{-1}R+F) \cdot u + (ET^{-1}S+G) \cdot p_1 = 0. \quad (EQ. 10)$$

In EQ. 40, $(ET^{-1}S+G)$ may be referred to as $\phi$, and its inverse may be stored. Inversion unit 410 may therefore compute the first parity symbol by retrieving the stored inverse and computing, $$p_1 = \phi^{-1} \cdot (ET^{-1}Ru + Fu) \cdot. \quad (EQ. 41)$$

Since R and F are sparse matrices, inversion unit 410 may compute Ru (=z) and Fu using few computational resources. Much of the computational complexity is derived from the computation of:

$$y = T^{-1}z. \quad (EQ. 42)$$

However, because T is triangular, inversion unit 410 can compute EQ. 42 using back substitution. In particular, EQ. 42 can be expressed as, $$\begin{bmatrix} z_1 \\ z_2 \\ z_3 \end{bmatrix} = \begin{bmatrix} t_{11}y_1 \\ t_{21}y_1 + t_{22}y_2 \\ t_{31}y_1 + t_{32}y_2 + t_{33}y_3 \end{bmatrix}, \quad (EQ. 43)$$

and inversion unit 410 may solve EQ. 43 row-by-row. That is, inversion unit 410 may solve the first row for $y_1$, may then use this value in the second row of EQ. 43 to solve for $y_2$, and finally may use the two computed values in the third row of EQ. 43 to solve for $y_3$. With the values of y computed in this fashion, inversion unit 410 may obtain the parity symbols according to, $$p_1 = \phi^{-1} \cdot (E \cdot y + F \cdot u), \quad (EQ. 44)$$

where the inverse of $\phi$ is small and stored in memory.

Continuing the example of FIG. 11, inversion unit 410 may compute the second parity symbol using the same back substitution technique as for the first parity symbol. From EQ. 38, inversion unit may calculate the value of the second parity symbol according to, $$p_2 = T^{-1}(Ru + Sp_1) \quad (EQ. 45)$$

using the value of the first parity symbol that was just computed. In particular, inversion unit 410 may first compute the value of $(Ru+Sp_1)$, and may then use the back substitution approach to obtain the symbol value of the second parity symbol.

From the example of FIG. 11 described above, the computational complexity of the blockwise inversion mechanism is affected by the back substitution procedures and the matrix-vector multiplication by a stored inverse, $\phi^{-1}$. The back substitution has a linear complexity and a runtime of O(s). The matrix-multiplication has a higher complexity and a runtime of $O(g^2)$, which may nevertheless be minimal due to the small size of g compared to s. Therefore, the overall runtime of $O(m+g^2)$ may be close to linear. These results may apply to a parity check matrix of any suitable size, and not just to the dimensions described in the example of FIG. 11. Thus, inversion unit 410 may be configured to perform an inversion operation using the blockwise inversion technique for any suitable parity check matrix that has a large triangular block in the B matrix.

Figure 12:
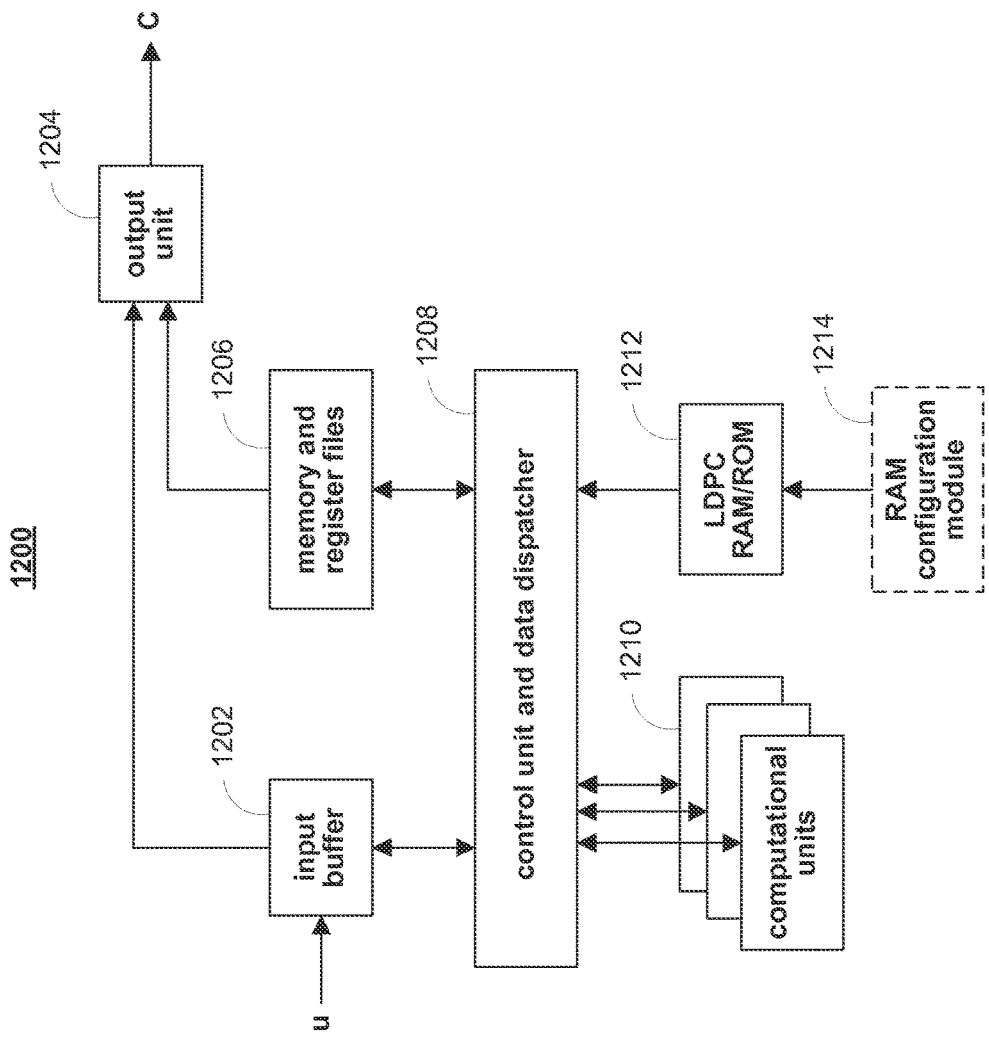
FIG. 12 is a simplified block diagram of a LDPC encoder operable to perform encoding based on LDPC codes having parity check matrices with various properties.
Figure 13:
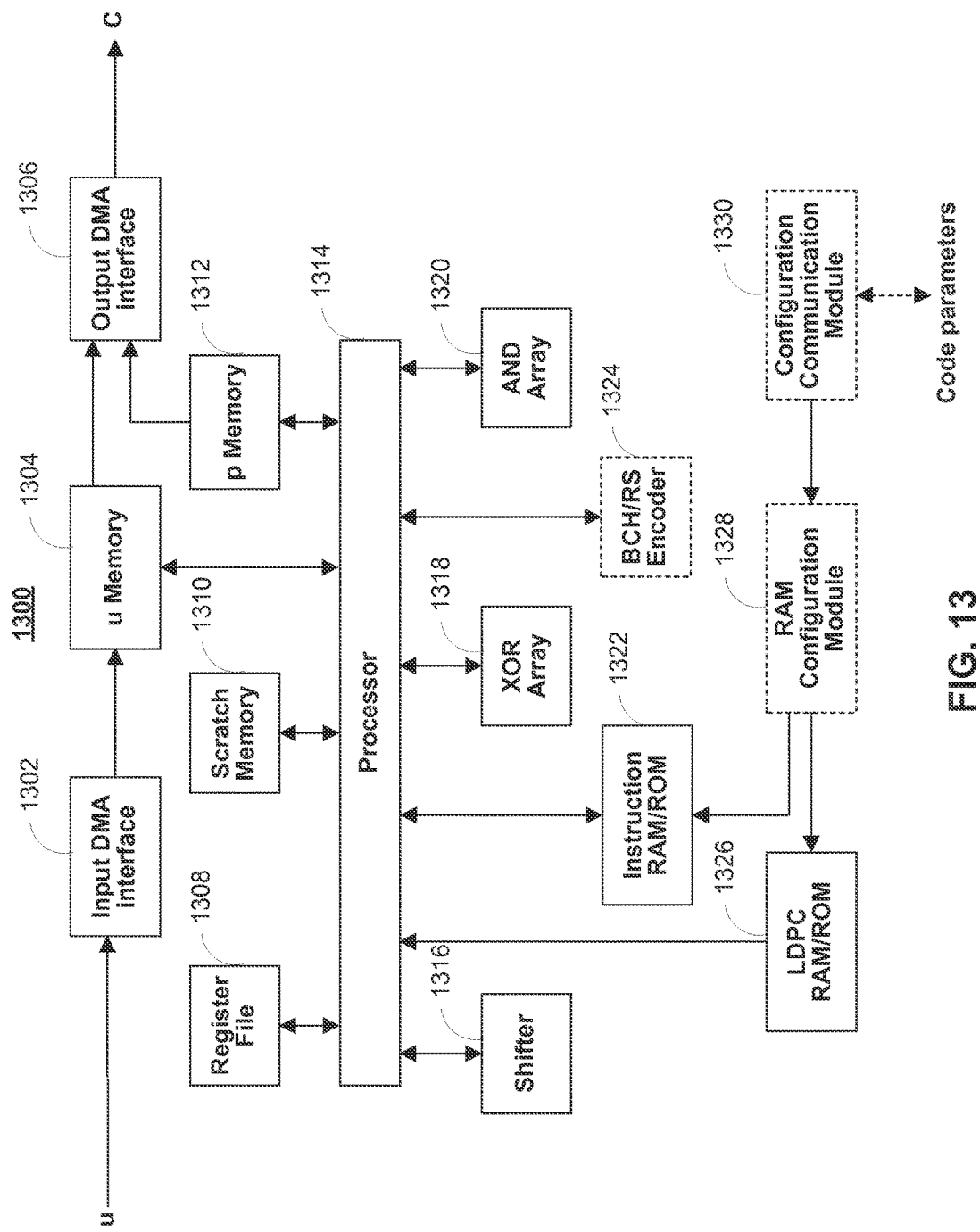
FIG. 13 is a simplified block diagram of a processor-based LDPC encoder operable to perform encoding based on LDPC codes having parity check matrices with various properties.
Figure 14:
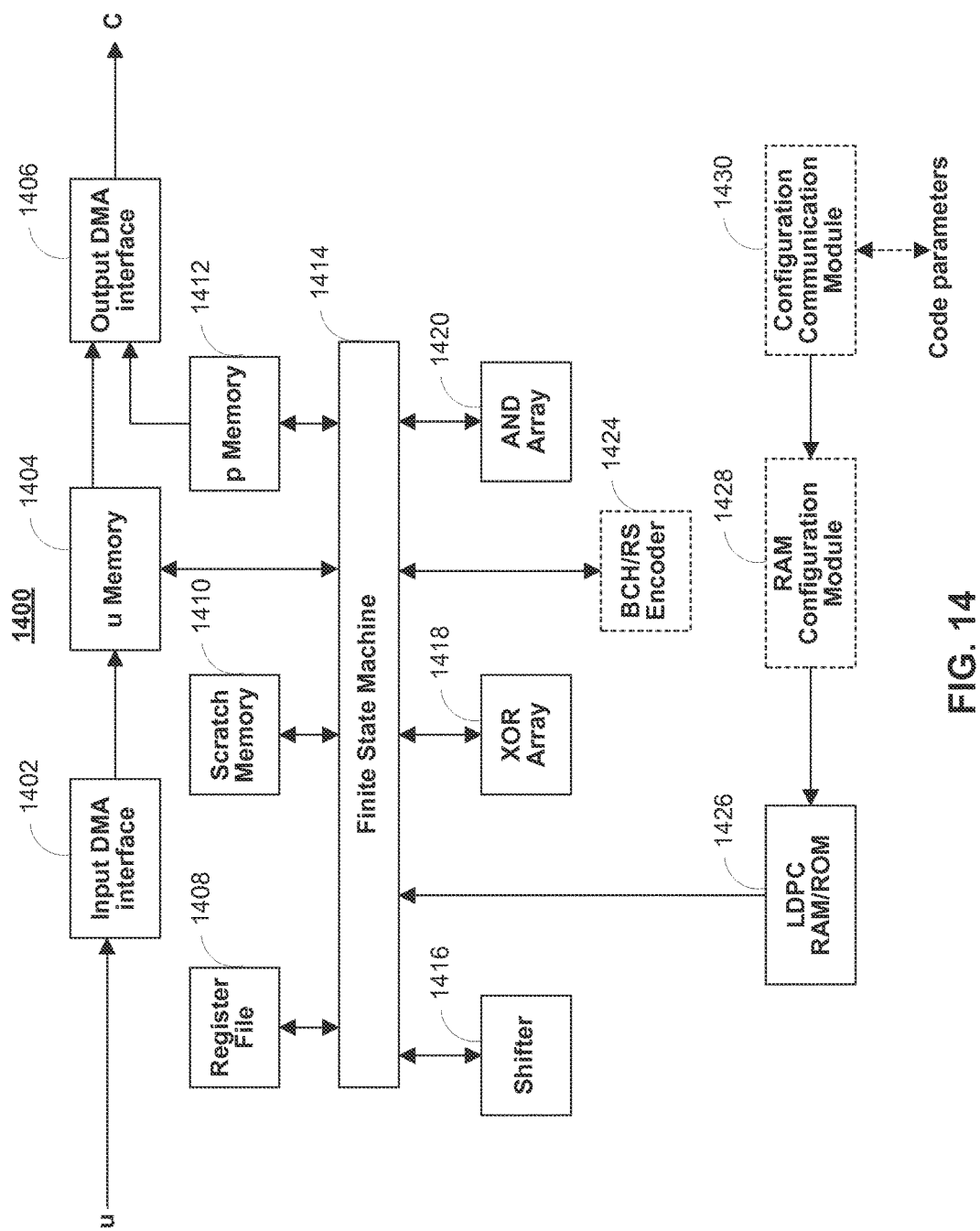
FIG. 14 is a simplified block diagram of a finite state machine (FSM)-based LDPC encoder operable to perform encoding based on LDPC codes having parity check matrices with various properties.

Referring now to FIGS. 12-14, generic LDPC encoders are shown that may perform any of the inversion mechanisms described above. The generic LDPC encoders of FIGS. 12-14 may be more detailed views of LDPC encoder 100 and/or LDPC encoder 400 of FIG. 4. These LDPC encoders are referred to as "generic," because the implementation of these LDPC encoders can be used for various encoding techniques (e.g., various inversion mechanisms). In some embodiments, the LDPC encoders may perform the QC-LDPC encoding operations described in the above-incorporated U.S. application Ser. No. 12/024,720, titled "LOW LATENCY PROGRAMMABLE ENCODER WITH OUTER SYSTEMATIC CODE AND LOW-DENSITY PARITY-CHECK CODE," filed Feb. 1, 2008, either with or without an outer systematic encoder. Thus, the generic encoders of FIGS. 12-14 may have any of the advantageous qualities described in the incorporated application, such as having variable code properties (e.g., code profile, block length, number of block rows, number of block columns, etc.), being able to start LDPC encoding at the same time as the outer systematic code encoder, interfacing with the outer systematic code encoder without additional memory buffers, and having reduced latency compared to previous encoders.

Referring first to FIG. 12, a simplified block diagram of generic LDPC encoder 1200 is illustrated. LDPC encoder 1200 can include input buffer 1202, output unit 1204, memory and register files 1206, control unit and data dispatcher 1208, computational units 1210, LDPC RAM/ROM 1212, and RAM configuration module 1214. LDPC RAM/ROM 1212 may store the parity check matrices used by LDPC encoder 1200, including the A matrix, the B matrix, and any other code-based information needed by encoder 1200 (e.g., $\phi^{-1}$). This information may be updated by RAM configuration module 1214 so that different LDPC codes may be supported by LDPC encoder 1200. In these embodiments, LDPC RAM/ROM 1212 may be implemented using a RAM or other dynamically re-writable storage medium. RAM configuration module 1214 is shown in dotted lines to indicate that this module may not be needed in some embodiments. Thus, in embodiments where RAM configuration module 1214 is not implemented, LDPC RAM/ROM 1212 may be implemented using a ROM-based storage medium.

During operation of LDPC encoder 1200, user information that will be encoded is first buffered in input buffer 1202. Control unit and data dispatcher 1208 may retrieve the user information from input buffer 1202 and encode the user information. To encode the user information, control unit and data dispatcher 1208 may control the operation of memory and register files 1206, computational units 1210, and LDPC RAM/ROM 1212. In particular, control unit 1208 may obtain the appropriate A and B matrix for the LDPC code from LDPC RAM/ROM 1212. Control unit 1208 may then use computational units 1210 to manipulate the user information from input buffer 1202 and the LDPC code data from LDPC RAM/ROM 1212 to compute parity symbols. For example, control unit 1208 may instruct computational units 1210 to perform the vector-matrix multiplication on the user information and the A matrix to obtain x. Control unit 1208 may also instruct computational units 1210 to perform one of the inversion mechanisms described above or in the above-incorporated applications to obtain the parity symbols. In some embodiments, computation units 1210 may include only modules that perform basic mathematical operations (e.g., XOR, AND, OR, permutations, shifts, etc.). Therefore, in these embodiments, all of encoding operations may be employed by control unit 1208. While computing the parity symbols, control unit 1208 may use memory and register files 1206 as temporary storage or scratch memory.

Control unit 1208 may then store the final values of the parity symbols in memory and register files 1206 for retrieval by output unit 1204. Output unit 1204 may output the LDPC codeword by retrieving the user information from input buffer 1202 and the parity symbols from memory and register files 1206. The retrieved user information and parity symbols may be concatenated to form a systematic codeword and outputted by output buffer 1204.

In FIG. 12, the components of LDPC encoder 1200 are generally controlled by control unit and data dispatcher 1208. Depending on the particular mechanisms employed by LDPC encoder 1200 (e.g., the particular inversion mechanism), control unit 1208 may instruct the various components of LDPC encoder 1200 to perform different operations or in different orders. Thus, depending on the way in which control unit 1208 is configured, control unit 1208 can compute the parity symbols based on any of the above-described techniques (e.g., any of the inversion mechanisms) or any of the techniques described in the above-incorporated applications. The implementation of LDPC encoder 1200 is therefore advantageously not limited to any particular type of LDPC encoding scheme.

Referring now to FIG. 13, an illustrative block diagram of a processor-based LDPC encoder is shown. LDPC encoder 1300 may be a more detailed view of LDPC encoder 1200 of FIG. 12 in which control unit and data dispatcher 1200 is implemented using any suitable type of processor (embodied by processor 1314). In addition to processor 1314, LDPC encoder 1300 can include input direct memory access (DMA) interface 1302, u memory 1304, output DMA interface 1306, register file 1308, scratch memory 1310, p memory 1312, shifter 1316, XOR array 1318, AND array 1320, instruction RAM/ROM 1322, BCH/RS encoder 1324, LDPC RAM/ROM 1326, RAM configuration module 1328, and configuration communication module 1330. U memory 1304, output DMA interface 1306, LDPC RAM/ROM 1326, and RAM configuration module 1328 may have any of the features and functionalities described above in connection with input buffer 1202, output buffer 1204, LDPC RAM/ROM 1212, and RAM configuration module 1214 of FIG. 12, respectively.

The operation of LDPC encoder 1300 may be controlled by processor 1314, which in turn is under program control by program code stored in instruction RAM/ROM 1322. Instruction RAM/ROM 1322 can include any suitable firmware or software that can be executed by processor 1314. Thus, by implementing or changing the program code stored in instruction RAM/ROM 1322, the particular encoding operations performed by LDPC encoder 1300 can be customized to one or more of any number of suitable encoding techniques. For example, instruction RAM/ROM 1322 can include program code for performing a speculative recursion and correction inversion mechanism, as described above in connection with FIG. 10. In some embodiments, instruction RAM/ROM 1322 can include program code that allows LDPC encoder 1300 to perform blockwise inversion instead of in addition to the speculative recursion and correction inversion mechanism. Generally, instruction RAM/ROM 1322 can include program code for employing one inversion mechanism or for a plurality of inversion mechanisms.

The program code stored in instruction RAM/ROM 1322 may be configured by RAM configuration module 1328. In particular, to implement or change the particular encoding schemes (e.g., inversion mechanisms) performed by processor 1314, RAM configuration module 1328 may provide configuration signals to LDPC RAM/ROM 1326 to program or reprogram LDPC RAM/ROM 1326 with new or updated instructions.

RAM configuration module 1326 may be coupled to configuration communication module 1330, which receives the new program code from any suitable source. For example, configuration communication module 1330 may be coupled to a compiler, such as compiler for a high level language (e.g., a MATLAB or C/C++ compiler). The MATLAB or C/C++ compiler may be configured to automatically generate program instructions for processor 1314 based on a parity check matrix or code parameter input into the compiler. In addition to generating program code for storage into instruction RAM/ROM 1322, through configuration communication module 1330, the MATLAB or C/C++ compiler may convert the parity check matrix into a form suitable for saving the parity check matrix in LDPC RAM/ROM 1326, and may compute any other matrices or configuration parameters that need to be saved for proper operation (e.g., $\phi^{-1}$). Thus, as shown in FIG. 13, communication module 1330 may be coupled to both instruction RAM/ROM 1322 and LDPC RAM/ROM 1326.

In some embodiments, RAM configuration module 1328 and/or configuration communication module 1330 may not be implemented in LDPC encoder 1300. These components are therefore shown in dotted lines in FIG. 13. In these embodiments, LDPC RAM/ROM 1326 and/or instruction RAM/ROM 1322 may not be reconfigurable after initial programming, and these memory components can be implemented using a suitable ROM-based storage medium (as opposed to a RAM-based storage medium).

During operation of LDPC encoder 1300, user information may be obtained through a direct memory access (DMA), for example. In these embodiments, the user information is received through input DMA interface 1302 and buffered in u memory 1304. U memory 1304 is coupled to processor 1314. Thus, the user information is available for processor 1314 to begin the encoding process.

With continued reference to FIG. 13, LDPC encoder 1300 may include register file 1308, scratch memory 1310, and p memory 1312. These memory components may collectively have any of the features and functionalities described above in connection with memory and registers files 1206 (FIG. 12). In particular, since LDPC encoder 1300 uses a processor-based approach, processor 1314 may need register file 1308 and scratch memory 1310 as temporary storage components during encoding. Once processor 1314 generates the parity symbols from the user information in u memory 1304, the parity symbols may be stored in p memory 1310. P memory 1310 is coupled to output DMA interface 1306, which creates a codeword from the parity symbols and the user information. Output DMA interface 1306 may then output the codeword at the appropriate time using a direct memory access, for example.

Each of the LDPC encoding operations described above and in the incorporated applications can be performed using shift, XOR, and AND components. For example, a shift component is used to cycle through each circulant in the A to set up a matrix-vector multiplication with the user information, while XOR and AND operations may be used to perform the actual matrix-vector multiplications. As another example, each of the above equations described in connection with the speculative recursion and correction and block-wise inversion mechanisms may be computed using XOR and AND operations. Thus, LDPC encoder 1300 can include shifter 1316, XOR array 1318, and AND array 1320 as the computational units of LDPC encoder 1300. That is, these components may be the only computational components that processor 1314 needs to compute parity symbols from user information.

In some embodiments, LDPC encoder 1300 can include a permuter (not shown) that performs like-named functions. The permuter may be implemented to allow LDPC encoder 1300 to perform encoding processes using LDPC codes that are not quasi-cyclic. For example, an M×M cyclic shifter embodied by shifter 1316, whose function is described in greater detail in the above-incorporated U.S. application Ser. No. 12/024,720, may be replaced in LDPC encoder 1300 by an M×M permuter. The M×M permuter may operate using a control sequence that is computed by an additional computational circuit (not shown) or is precomputed and stored in additional memory (not shown). Thus, it should be understood that LDPC encoder 1300 and its computational methods (e.g., inversion mechanisms) are not limited to use with quasi-cyclic codes.

In some embodiments, LDPC encoder 1300 may be used in conjunction with an outer code encoder, such as BCH/RS encoder 1324. In these embodiments, BCH/RS encoder 1324 may coupled to processor 1314, and processor 1314 may use the parity bits generated by BCH/RS encoder 1324 as part of the user information that needs to be encoded. Processor 1314 may perform any of the processes described in the above-incorporated U.S. application Ser. No. 12/024,720, to, among other things, enable LDPC encoding to operate concurrently with the BCH/RS encoding executed by BCH/RS encoder 1324.

Referring now to FIG. 14, an illustrative block diagram of a FSM-based LDPC encoder is shown. LDPC encoder 1400 may be a more detailed view of LDPC encoder 1200 of FIG. 12 in which control unit and data dispatcher 1200 is implemented using a suitable finite state machine (embodied by finite state machine (FSM) 1414). In addition to FSM 1414, LDPC encoder 1400 can include input direct memory access (DMA) interface 1402, u memory 1404, output DMA interface 1406, register file 1408, scratch memory 1410, p memory 1412, shifter 1416, XOR array 1418, AND array 1420, BCH/RS encoder 1424, LDPC RAM/ROM 1426, RAM configuration module 1428, and configuration communication module 1430. Many of these components correspond to components with the same name in FIG. 13. These components may have any of the features and functionalities of their corresponding components in FIG. 13. Also, as with FIG. 13, LDPC encoder 1400 may include a permuter, and any associated with circuitry, in addition to or instead of shifter 1416.

The components of LDPC encoder 1400 are generally controlled by finite state machine 1414. As with instruction RAM/ROM 1322 (FIG. 13), finite state machine 1414 may be configured by an external module coupled to configuration communication module 1430, such as a MATLAB or C/C++ compiler. In some embodiments, finite state machine 1414 may be implemented on an application specific integrated circuit (ASIC) in the form of gates.

As with the processor-based approach, LDPC encoder 1400 may be operable to perform encoding using a variety of different LDPC code structures. In particular, in embodiments where LDPC encoder 1400 is hard-wired (e.g., in an ASIC) to use a particular H matrix, the components of LDPC encoder 1400 coupled to FSM 1414 may be implemented in substantially the same manner regardless of which LDPC code structure (and therefore which inversion mechanism) is used. To enable coding using the particular H matrix, FSM 1414 may be configured to direct these components to perform the appropriate encoding operations. That is, all of the encoding functionality associated with the particular H matrix may be provided by FSM 1414. Using this FSM-based approach and a suitable compiler (e.g., a high level language compiler, such as a MATLAB/C compiler), the design of the FSM may be advantageously optimized for the particular H matrix implemented by LDPC encoder 1400. Therefore, even with the advantageous generic qualities of LDPC encoder 1400, LDPC encoder 1400 may still have many of the advantages of a design that is customized for a particular H matrix. Also, the high level language approach (e.g., with MATLAB/C) used to generate FSMs (e.g., gates) can be used to create LDPC encoders with other parity check matrix structures with substantially the same encoder components.

It should be understood that the embodiments of FIGS. 12-14 are merely illustrative, and that modules may be added, modified, or removed without departing from the spirit of the present invention. Moreover, the disclosed embodiments are not limited to any particular application. For example, the disclosed embodiments may be implemented in any suitable wired or wireless communications system (e.g., systems employing the IEEE 802.3 standard for 10-GB Ethernet, digital video broadcasting systems (e.g., DVB-S2), or satellite communications systems) or in any memory application (as described in connection with FIG. 1). Thus, the disclosed embodiments provide a generic encoder that can employ different LDPC codes, such as different QC-LDPC codes, with different parity check matrix properties for various applications.

Referring now to FIGS. 15-19, various exemplary implementations of the present invention are shown.

Figure 15:
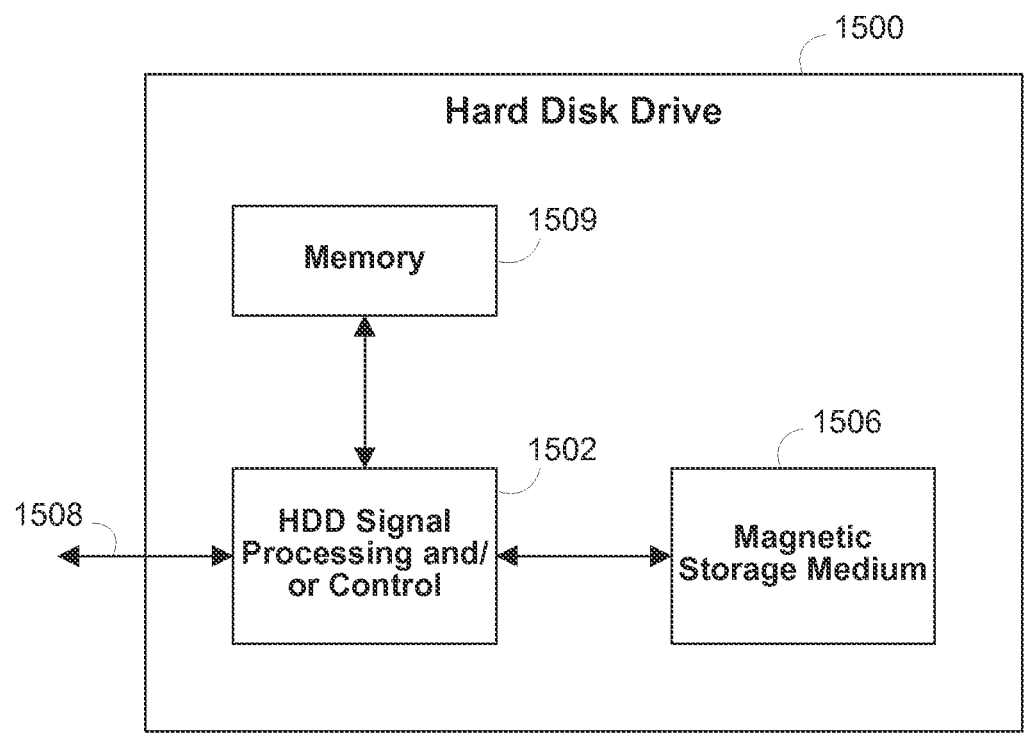
FIG. 15 is a block diagram of an exemplary hard disk drive that can employ the disclosed technology.

Referring now to FIG. 15, the present invention can be implemented in a hard disk drive (HDD) 1500. The present invention may implement either or both signal processing and/or control circuits, which are generally identified in FIG. 15 at 1502. In some implementations, the signal processing and/or control circuit 1502 and/or other circuits (not shown) in the HDD 1500 may process data, perform coding and/or encryption, perform calculations, and/or format data that is output to and/or received from a magnetic storage medium 1506.

The HDD 1500 may communicate with a host device (not shown) such as a computer, mobile computing devices such as personal digital assistants, cellular phones, media or MP3 players and the like, and/or other devices via one or more wired or wireless communication links 1508. The HDD 1500 may be connected to memory 1509 such as random access memory (RAM), nonvolatile memory such as flash memory, read only memory (ROM) and/or other suitable electronic data storage.

Figure 16:
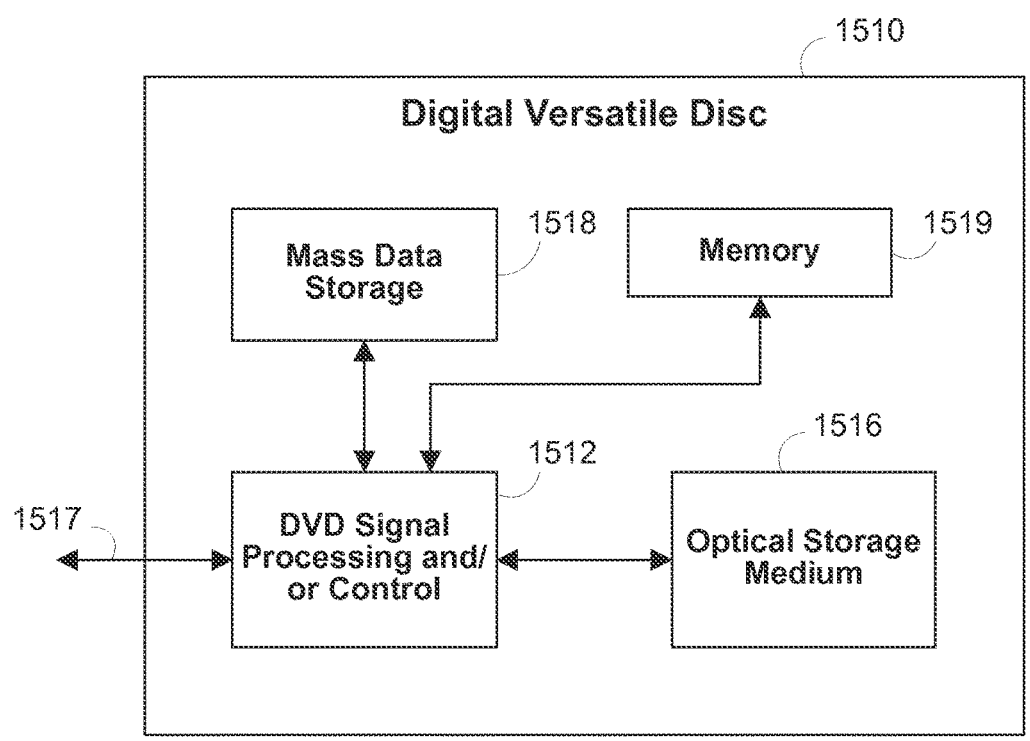
FIG. 16 is a block diagram of an exemplary digital versatile disc that can employ the disclosed technology.

Referring now to FIG. 16, the present invention can be implemented in a digital versatile disc (DVD) drive 1510. The present invention may implement either or both signal processing and/or control circuits, which are generally identified in FIG. 16 at 1512, and/or mass data storage 1518 of the DVD drive 1510. The signal processing and/or control circuit 1512 and/or other circuits (not shown) in the DVD drive 1510 may process data, perform coding and/or encryption, perform calculations, and/or format data that is read from and/or data written to an optical storage medium 1516. In some implementations, the signal processing and/or control circuit 1512 and/or other circuits (not shown) in the DVD drive 1510 can also perform other functions such as encoding and/or decoding and/or any other signal processing functions associated with a DVD drive.

The DVD drive 1510 may communicate with an output device (not shown) such as a computer, television or other device via one or more wired or wireless communication links 1517. The DVD drive 1510 may communicate with mass data storage 1518 that stores data in a nonvolatile manner. The mass data storage 1518 may include a hard disk drive (HDD). The HDD may have the configuration shown in FIG. 15. The HDD may be a mini HDD that includes one or more platters having a diameter that is smaller than approximately 1.8". The DVD drive 1510 may be connected to memory 1519 such as RAM, ROM, nonvolatile memory such as flash memory and/or other suitable electronic data storage.

Figure 17:
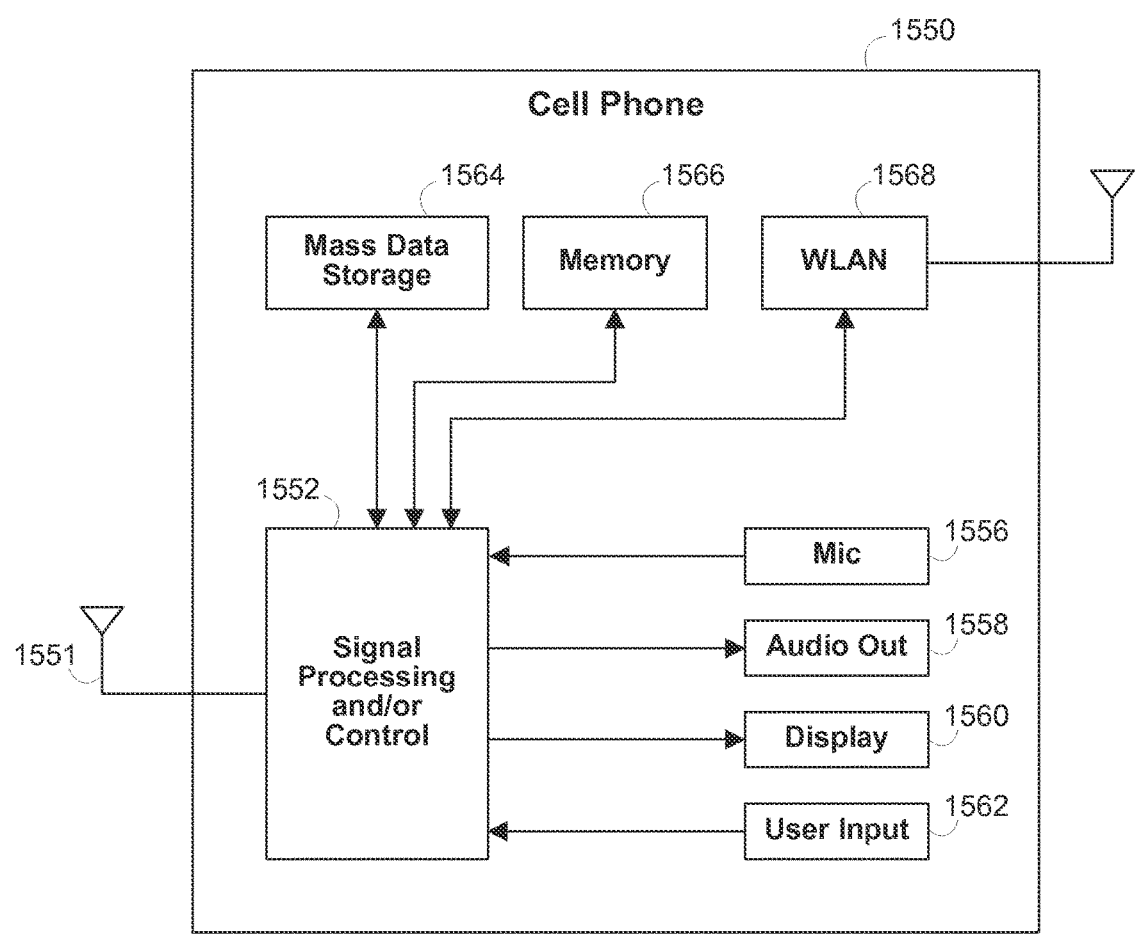
FIG. 17 is a block diagram of an exemplary cell phone that can employ the disclosed technology.

Referring now to FIG. 17, the present invention can be implemented in a cellular phone 1550 that may include a cellular antenna 1551. The present invention may implement either or both signal processing and/or control circuits, which are generally identified in FIG. 17 at 1552, a WLAN network interface 1568 and/or mass data storage 1564 of the cellular phone 1550. In some implementations, the cellular phone 1550 includes a microphone 1556, an audio output 1558 such as a speaker and/or audio output jack, a display 1560 and/or an input device 1562 such as a keypad, pointing device, voice actuation and/or other input device. The signal processing and/or control circuits 1552 and/or other circuits (not shown) in the cellular phone 1550 may process data, perform coding and/or encryption, perform calculations, format data and/or perform other cellular phone functions.

The cellular phone 1550 may communicate with mass data storage 1564 that stores data in a nonvolatile manner such as optical and/or magnetic storage devices for example hard disk drives and/or DVDs. At least one HDD may have the configuration shown in FIG. 15 and/or at least one DVD may have the configuration shown in FIG. 16. The HDD may be a mini HDD that includes one or more platters having a diameter that is smaller than approximately 1.8". The cellular phone 1550 may be connected to memory 1566 such as RAM, ROM, nonvolatile memory such as flash memory and/or other suitable electronic data storage. The cellular phone 1550 also may support connections with a WLAN via WLAN network interface 1568.

Figure 18:
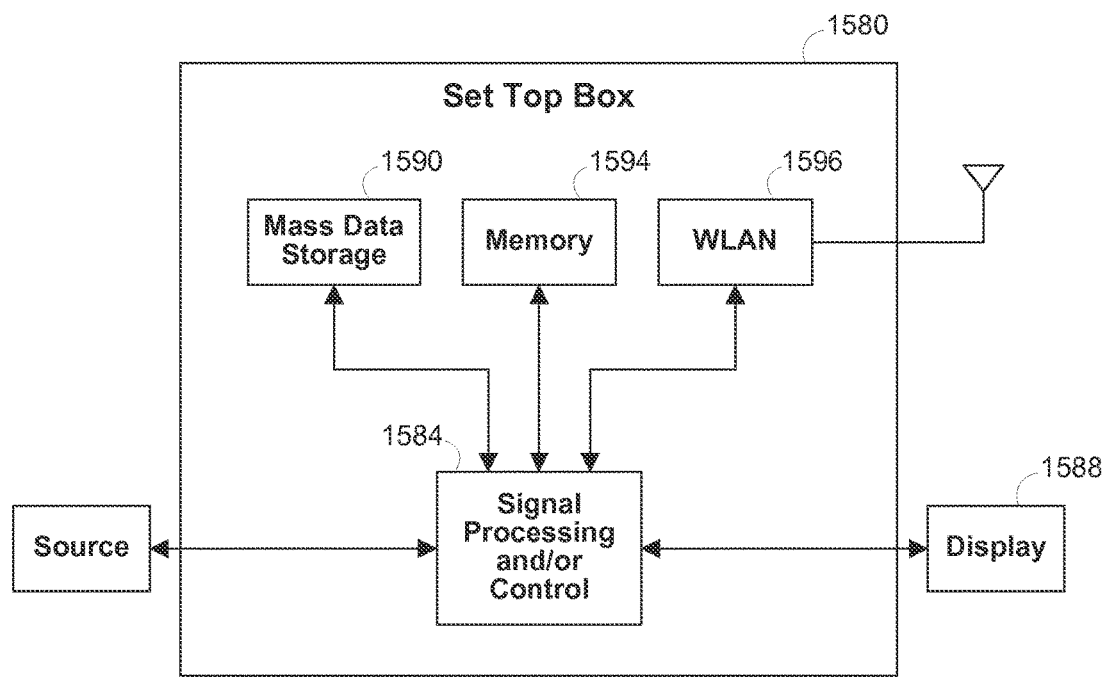
FIG. 18 is a block diagram of an exemplary set top box that can employ the disclosed technology.

Referring now to FIG. 18, the present invention can be implemented in a set top box 1580. The present invention may implement either or both signal processing and/or control circuits, which are generally identified in FIG. 18 at 1584, a WLAN network interface 1596 and/or mass data storage 1590 of the set top box 1580. The set top box 1580 receives signals from a source such as a broadband source and outputs standard and/or high definition audio/video signals suitable for a display 1588 such as a television and/or monitor and/or other video and/or audio output devices. The signal processing and/or control circuits 1584 and/or other circuits (not shown) of the set top box 1580 may process data, perform coding and/or encryption, perform calculations, format data and/or perform any other set top box function.

The set top box 1580 may communicate with mass data storage 1590 that stores data in a nonvolatile manner. The mass data storage 1590 may include optical and/or magnetic storage devices for example hard disk drives and/or DVDs. At least one HDD may have the configuration shown in FIG.

15 and/or at least one DVD may have the configuration shown in FIG. 16. The HDD may be a mini HDD that includes one or more platters having a diameter that is smaller than approximately 1.8". The set top box 1580 may be connected to memory 1594 such as RAM, ROM, nonvolatile memory such as flash memory and/or other suitable electronic data storage. The set top box 1580 also may support connections with a WLAN via a WLAN network interface 1596.

Figure 19:
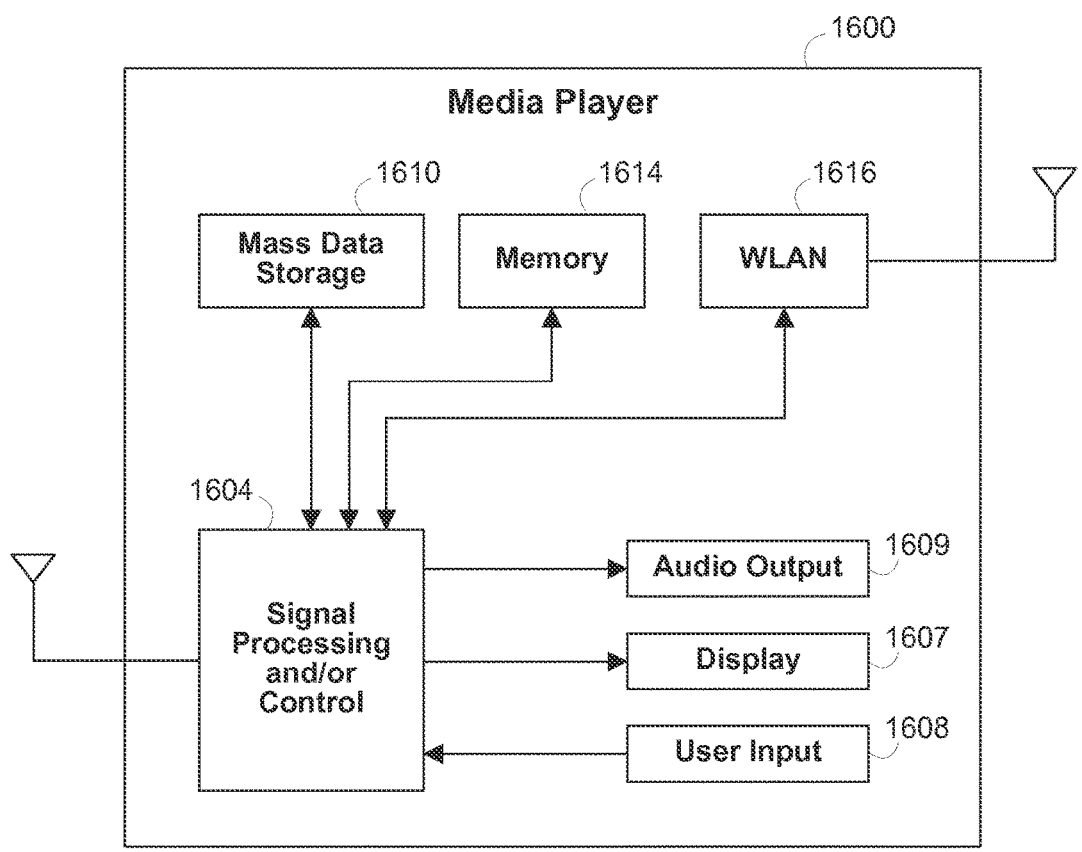
FIG. 19 is a block diagram of an exemplary media player that can employ the disclosed technology.

Referring now to FIG. 19, the present invention can be implemented in a media player 1600. The present invention may implement either or both signal processing and/or control circuits, which are generally identified in FIG. 19 at 1604, WLAN network interface 1616 and/or mass data storage 1610 of the media player 1600. In some implementations, the media player 1600 includes a display 1607 and/or a user input 1608 such as a keypad, touchpad and the like. In some implementations, the media player 1600 may employ a graphical user interface (GUI) that typically employs menus, drop down menus, icons and/or a point-and-click interface via the display 1607 and/or user input 1608. The media player 1600 further includes an audio output 1609 such as a speaker and/or audio output jack. The signal processing and/or control circuits 1604 and/or other circuits (not shown) of the media player 1600 may process data, perform coding and/or encryption, perform calculations, format data and/or perform any other media player function.

The media player 1600 may communicate with mass data storage 1610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 15 and/or at least one DVD may have the configuration shown in FIG. 16. The HDD may be a mini HDD that includes one or more platters having a diameter that is smaller than approximately 1.8". The media player 1600 may be connected to memory 1614 such as RAM, ROM, nonvolatile memory such as flash memory and/or other suitable electronic data storage. The media player 1600 also may support connections with a WLAN via WLAN network interface 1616. Still other implementations in addition to those described above are contemplated.

The foregoing describes systems and methods for encoding a message using a generic LDPC encoder. Those skilled in the art will appreciate that the invention can be practiced by other than the described embodiments, which are presented for the purpose of illustration rather than of limitation.

What is claimed is:

1. A method for generating parity symbols for a low density parity check (LDPC) code having a parity check matrix comprising a data portion and a parity portion, the method comprising:
processing, using control circuitry, a vector of data symbols with the data portion of the parity check matrix to obtain an intermediate vector;
determining an initial parity symbol based on the parity portion of the parity check matrix and a symbol at substantially one end of the intermediate vector; and
processing the initial parity symbol and the intermediate vector to obtain one or more additional parity symbols, wherein the processing is based on the parity portion of the parity check matrix.

2. The method of claim 1, wherein the processing of the initial parity symbol and the intermediate vector comprises:
initiating a recursion to obtain the one or more additional parity symbols.

3. The method of claim 2, wherein the one end of the intermediate vector is a first end, the method further comprising:
terminating the recursion in response to determining that a second end of the intermediate vector has been reached, wherein the second end is substantially opposite to the first end.

4. The method of claim 2, wherein the recursion is a first recursion and the one end of the intermediate vector is a first end, the method further comprising:
initiating a second recursion from a second end of the intermediate vector to obtain the one or more additional parity symbols, wherein the second end is substantially opposite to the first end.

5. The method of claim 1, wherein the parity portion of the parity check matrix is a dual-diagonal matrix.

6. The method of claim 1, wherein the initial parity symbol is a first initial parity symbol, the method further comprising:
generating a speculative value for a second initial parity symbol; and
processing the first initial parity symbol, the speculative value for the second initial parity symbol, and the intermediate vector to obtain speculative values for the one or more additional parity symbols.

7. The method of claim 6, wherein the one end of the intermediate vector is a first end, the method further comprising:
determining a correction factor based on a correct value of a parity symbol corresponding to a second end of the intermediate vector, wherein the second end is substantially opposite to the first end; and
correcting the speculative values for the one or more additional parity symbols based on the correction factor to obtain correct values of the one or more additional parity symbols.

8. The method of claim 6, wherein the parity portion of the parity check matrix is a tri-diagonal matrix.

9. The method of claim 6, wherein the speculative value of the second initial parity symbol is a predetermined value.

10. The method of claim 1, wherein the parity check matrix corresponds to a parity check matrix defined by the IEEE 802.11n standard.

11. A system for generating parity symbols for a low density parity check (LDPC) code having a parity check matrix comprising a data portion and a parity portion, the system comprising:
initialization circuitry configured to process a vector of data symbols with the data portion of the parity check matrix to obtain an intermediate vector; and
decoding circuitry configured to:
determine an initial parity symbol based on the parity portion of the parity check matrix and a symbol at substantially one end of the intermediate vector; and
process the initial parity symbol and the intermediate vector to obtain one or more additional parity symbols, wherein the processing is based on the parity portion of the parity check matrix.

12. The system of claim 11, wherein the decoding circuitry processes the initial parity symbol and the intermediate vector by being configured to:
    initiate a recursion to obtain the one or more additional parity symbols.

13. The system of claim 12, wherein the one end of the intermediate vector is a first end and the decoding circuitry is further configured to:
    terminate the recursion in response to determining that a second end of the intermediate vector has been reached, wherein the second end is substantially opposite to the first end.

14. The system of claim 12, wherein the recursion is a first recursion, the one end of the intermediate vector is a first end, and the decoding circuitry is further configured to:
    initiate a second recursion from a second end of the intermediate vector to obtain the one or more additional parity symbols, wherein the second end is substantially opposite to the first end.

15. The system of claim 11, wherein the parity portion of the parity check matrix is a dual-diagonal matrix.

16. The system of claim 11 wherein the initial parity symbol is a first initial parity symbol and the decoding circuitry is further configured to:
    generate a speculative value for a second initial parity symbol; and
    process the first initial parity symbol, the speculative value for the second initial parity symbol, and the intermediate vector to obtain speculative values for the one or more additional parity symbols.

17. The system of claim 16, wherein the one end of the intermediate vector is a first end and the decoding circuitry is further configured to:
    determine a correction factor based on a correct value of a parity symbol corresponding to a second end of the intermediate vector, wherein the second end is substantially opposite to the first end; and
    correct the speculative values for the one or more additional parity symbols based on the correction factor to obtain correct values of the one or more additional parity symbols.

18. The system of claim 16, wherein the parity portion of the parity check matrix is a tri-diagonal matrix.

19. The system of claim 16, wherein the speculative value of the second initial parity symbol is a predetermined value.

20. The system of claim 11, wherein the parity check matrix corresponds to a parity check matrix defined by the IEEE 802.11n standard.

* * * * *